(12) United States Patent
Martinez et al.

(10) Patent No.: US 11,996,274 B2
(45) Date of Patent: May 28, 2024

(54) REAL-TIME, NON-INVASIVE IEDF PLASMA SENSOR

(71) Applicant: MKS Instruments, Inc., Andover, MA (US)

(72) Inventors: Linnell Martinez, San Jose, CA (US); David Miller, Rochester, NY (US); Eldridge Mount, IV, Macedon, NY (US); Peter Paul, Penfield, NY (US); Aaron Radomski, Conesus, NY (US)

(73) Assignee: MKS Instruments, Inc., Andover, MA (US)

( * ) Notice: Subject to any disclaimer, the term of this patent is extended or adjusted under 35 U.S.C. 154(b) by 174 days.

(21) Appl. No.: 17/715,672

(22) Filed: Apr. 7, 2022

(65) Prior Publication Data

US 2023/0326727 A1    Oct. 12, 2023

(51) Int. Cl.
*H01J 37/32* (2006.01)

(52) U.S. Cl.
CPC .. *H01J 37/32935* (2013.01); *H01J 37/32128* (2013.01); *H01J 37/32183* (2013.01); *H01J 37/3299* (2013.01)

(58) Field of Classification Search
CPC ............ H01J 37/3299; H01J 37/32128; H01J 37/32174; H01J 37/32183; H01J 37/32935

See application file for complete search history.

(56) References Cited

U.S. PATENT DOCUMENTS

| 5,467,013 A | 11/1995 | Williams et al. |
| 5,936,413 A | 8/1999 | Booth et al. |
| 6,201,208 B1 | 3/2001 | Wendt et al. |
| 7,602,127 B2 | 10/2009 | Coumou |

(Continued)

FOREIGN PATENT DOCUMENTS

| KR | 10-2008-0075799 A | 8/2008 |
| WO | WO-2011036103 A1 | 3/2011 |
| WO | WO-2019199635 A1 | 10/2019 |

OTHER PUBLICATIONS

International Search Report and Written Opinion regarding International Patent Application No. PCT/US2023/010609, dated May 12, 2023.

(Continued)

*Primary Examiner* — Tung X Le
(74) *Attorney, Agent, or Firm* — Harness, Dickey & Pierce, P.L.C.

(57) ABSTRACT

A controller for a plasma generation system includes a model evaluation module receives a sensed value that varies in accordance with a state of a plasma controlled by a RF power generator. The model evaluation module generates a plasma parameter that varies in accordance with the sensed value. A model integration module receives the plasma parameter, integrates the plasma parameter, and outputs an integrated model parameter. An IEDF evaluation module receives the integrated model parameter and generates an ion energy distribution function (IEDF) in accordance with the integrated model parameter. An IEDF controller module (Continued)

receives the IEDF and generates a signal for controlling a RF generator. A RF generator control module receives the signal and generates an RF generator control signal to control at least one of power, frequency, or phase of the RF power generator.

39 Claims, 15 Drawing Sheets

(56) References Cited

U.S. PATENT DOCUMENTS

| | | | |
|---|---|---|---|
| 8,110,991 | B2 | 2/2012 | Coumou |
| 8,395,322 | B2 | 3/2013 | Coumou |
| 9,287,086 | B2 | 3/2016 | Brouk et al. |
| 9,620,334 | B2 * | 4/2017 | Lyndaker .............. H03H 7/40 |
| 9,767,988 | B2 | 9/2017 | Brouk et al. |
| 10,049,857 | B2 | 8/2018 | Fisk, II et al. |
| 10,395,895 | B2 | 8/2019 | Coumou et al. |
| 10,410,836 | B2 * | 9/2019 | McChesney ...... H01J 37/32183 |
| 10,504,744 | B1 * | 12/2019 | Yanagawa ......... H01L 21/31116 |
| 10,546,724 | B2 | 1/2020 | Radomski et al. |
| 10,821,542 | B2 | 11/2020 | Nelson et al. |
| 10,950,421 | B2 * | 3/2021 | Valcore, Jr. ....... H01J 37/32183 |
| 11,158,488 | B2 | 10/2021 | Radomski et al. |
| 11,901,157 | B2 * | 2/2024 | Cui .................. H01J 37/32027 |
| 2004/0112536 | A1 | 6/2004 | Quon |
| 2012/0232817 | A1 | 9/2012 | O'Sullivan et al. |
| 2014/0061156 | A1 | 3/2014 | Brouk et al. |
| 2015/0144596 | A1 | 5/2015 | Brouk et al. |
| 2019/0066979 | A1 * | 2/2019 | Shoeb ................ H01L 21/6833 |
| 2020/0266022 | A1 | 8/2020 | Dorf et al. |
| 2021/0351007 | A1 * | 11/2021 | Carter .............. H01J 37/32137 |

OTHER PUBLICATIONS

Binwal, S., et al. "Non-Invasive Plasma Density Measurement in a 13.56 MHZ Magnetized Capactive Coupled RF Discharge." No. IAEA-CN-123/45 (2018).

Bogdanova, M. A., et al. ""Virtual IED Sensor" at an RF-Biased Electrode in Low-Pressure Plasma." Physics of Plasmas 23 (2016): 073510.

Choi, Myung-sun, et al. "Monitoring Ion Energy Distribution in Capacitively Coupled Plasmas Using Non-invasive Radio-Frequency Voltage Measurements." Applied Science and Convergence Technology vol. 23 No. 6 (Nov. 2014): 357-365.

Rauf, Shahid, and Mark J. Kushner. "Diagnostic Technique for Measuring Plasma Parameters Near Surfaces in Radio Frequency Discharges." Applied Physics Letters 73. No. 19 (Nov. 9, 1998): 2730-2732.

Sobolewski, Mark A. "Noninvasive Monitoring of Ion Current and Ion Energy During Plasma Processing." Electrochemical Society Meeting Abstracts MA Jan. 2008 741 (2008).

Sobolewski, Mark A. "Novel Ion Current Sensor for Real-time, in-situ Monitoring and Control of Plasma Processing." AIP Conference Proceedings. vol. 449., 449 (1998), Published Online Mar. 27, 2008).

Virostko, P., et al. "Measuring the Ion Current to the Substrate During Deposition of Thin Films by Hollow Cathode Plasma Jet." WDS. vol. 7. Proceedings of Contributed Papers, Part II, 212-217, (2007).

Wendt, Amy "Non-invasive Measurements of Plasma Parameters via Optical Emission Spectroscopy." Dept. of Electrical and Computer Engineering, University of Wisconsin-Madison, Michigan Institute for Plasma Science and Engineering (Dec. 10, 2014).

* cited by examiner

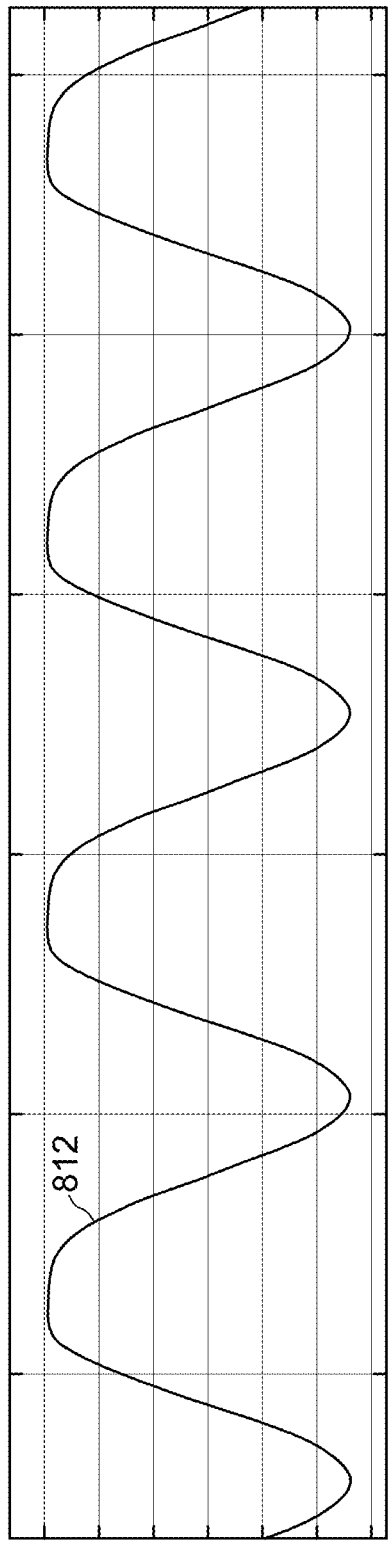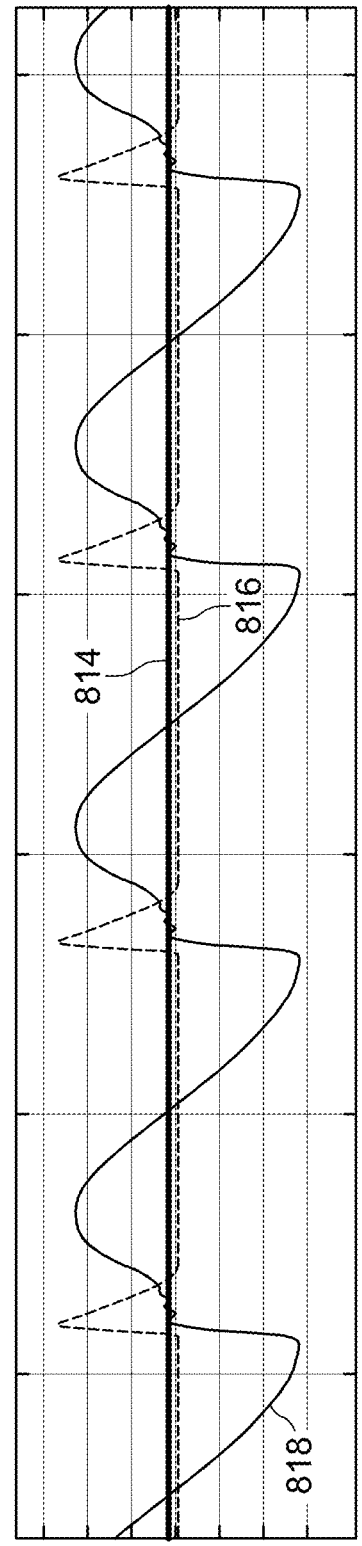

REAL-TIME, NON-INVASIVE IEDF PLASMA SENSOR

FIELD

The present disclosure relates to RF generator systems and to control of RF generators.

BACKGROUND

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a controller for a plasma generation system. The controller also includes a model evaluation module configured to receive a sensed value that varies in accordance with a state of a plasma controlled by a RF power generator, the model evaluation module generating a plasma parameter, where the plasma parameter varies in accordance with the sensed value. The controller also includes a model integration module configured to receive the plasma parameter and configured to integrate the plasma parameter and output an integrated model parameter. The controller also includes an IEDF evaluation module configured to receive the integrated model parameter and generate an ion energy distribution function (IEDF) in accordance with the integrated model parameter. The controller also includes an IEDF controller module configured to receive the IEDF and generate a signal for controlling a RF generator. The controller also includes a RF generator control module configured to receive the signal and generate a RF generator control signal to control at least one of power, frequency, or phase of the RF power generator. Other embodiments of this aspect include corresponding computer systems, apparatus, and computer programs recorded on one or more computer storage devices, each configured to perform the actions of the methods.

Implementations may include one or more of the following features. The controller may include an optimization module configured to receive the integrated model parameter and compare the integrated model parameter with a predetermined parameter used to define the model and revise the predetermined parameter in accordance with the comparison. The RF power generator is a bias RF generator, and the IEDF varies in accordance with the at least one of the power, frequency, or phase of the bias RF generator. The integrated model parameter varies in accordance with an ion potential of the plasma. The integrated model parameter is an effective ion potential waveform, and the effective ion potential waveform characterizes an ion potential of the plasma. The RF generator control module is configured to receive the effective ion potential waveform to control at least one of power, frequency, or phase of the RF power generator. The RF power generator may include a plurality of RF power generators, and the output of the RF power generators is combined and applied to the plasma. The sensed value can be detected at a plurality of positions in the plasma generation system. The RF power generator provides an output signal that may be one of a sinusoidal signal, square wave signal, rectangular wave signal, triangular signal, gaussian signal, piecewise linear signal, narrow pulse voltage peak followed by a ramp down signal, or an arbitrary signal. The output signal is modulated by a pulse signal. The pulse signal is one of trapezoidal, triangular, gaussian, or arbitrary in shape. Implementations of the described techniques may include hardware, a method or process, or computer software on a computer-accessible medium.

One general aspect includes a RF power generation system. The RF power generation system also includes a RF power generator generating a RF output signal applied to a load to generate a plasma. The system also includes a model evaluation module configured to receive a sensed value that varies in accordance with a state of the plasma, the model evaluation module determining a plasma parameter, where the plasma parameter varies in accordance with the sensed value. The system also includes a model integration module configured to receive the plasma parameter and configured to integrate the plasma parameter and output an integrated model parameter. The system also includes a RF generator control module configured to receive the integrated model parameter and generate the RF generator control signal to control at least one of power, frequency, or phase of the RF power generator in accordance with the integrated model parameter. Other embodiments of this aspect include corresponding computer systems, apparatus, and computer programs recorded on one or more computer storage devices, each configured to perform the actions of the methods.

Implementations may include one or more of the following features. The RF power generation system where the RF power generator is a bias RF generator, and the integrated model parameter varies in accordance with at least one of frequency, or phase of the bias RF generator. The RF power generation system may include an IEDF evaluation module configured to receive the integrated model parameter and generate an ion energy distribution function (IEDF) in accordance with the integrated model parameter. The RF generator control module is configured to receive the IEDF and generate a RF generator control signal to control at least one of power, frequency, or phase of the RF power generator in accordance with the integrated model parameter or the IEDF. The RF power generation system may include an IEDF controller module configured to receive the IEDF and generate a signal for controlling a RF generator. The RF generator control module is configured to receive the IEDF and generate the RF generator control signal to control at least one of power, frequency, or phase of the RF power generator in accordance with the integrated model parameter or the IEDF. The RF power generator is a bias RF generator, and the IEDF varies in accordance with the at least one of the power, frequency, or phase of the bias RF generator. The RF power generation system may include an optimization module configured to receive the integrated model parameter and compare the integrated model parameter with predetermined parameter used to define the model and revise the predetermined parameter in accordance with the comparison. The integrated model parameter varies in accordance with an ion potential of the plasma. The RF power generator may include a plurality of RF power generators, and the output of the RF power generators is combined and applied to the plasma. The sensed value can be detected at a plurality of positions in the RF generation system. The RF output signal is one of a sinusoidal signal, square wave signal, rectangular wave signal, triangular signal, gaussian signal, piecewise linear signal, narrow pulse voltage peak followed by a ramp down signal, or an arbitrary signal. The RF output signal is modulated by a pulse signal. The pulse signal is one of trapezoidal, triangular, gaussian, or arbitrary in shape. Implementations of the described techniques may include hardware, a method or process, or computer software on a computer-accessible medium.

One general aspect includes a non-transitory computer-readable medium storing instructions. The non-transitory computer readable medium storing instructions also includes generating a RF output signal applied to a load to generate a plasma. The instructions also include receiving a sensed value that varies in accordance with a state of the plasma, and determining plasma parameters, where the plasma parameter varies in accordance with the sensed value. The instructions also include receiving the plasma parameter, integrating the plasma parameters, and generating an integrated model parameter. The instructions also include receiving the integrated model parameter, generating a RF generator control signal to control at least one of power, frequency, or phase of a RF power generator in accordance with the integrated model parameter. Other embodiments of this aspect include corresponding computer systems, apparatus, and computer programs recorded on one or more computer storage devices, each configured to perform the actions of the methods.

Implementations may include one or more of the following features. The non-transitory computer-readable medium storing instructions where the RF power generator is a bias RF generator, and the integrated model parameter varies in accordance with at least one of frequency, or phase of the bias RF generator. The non-transitory computer-readable medium storing instructions the instructions may include receiving the integrated model parameter and generating an ion energy distribution function (IEDF) in accordance with the integrated model parameter. Implementations of the described techniques may include hardware, a method or process, or computer software on a computer-accessible medium.

The non-transitory computer-readable medium storing instructions the instructions may include receiving the IEDF and generating a RF generator control signal to control at least one of power, frequency, or phase of the RF power generator in accordance with the integrated model parameter or the IEDF. The non-transitory computer-readable medium storing instructions the instructions may include receiving the IEDF and generating a signal for controlling a RF generator. The non-transitory computer-readable medium storing instructions the instructions may include receiving the IEDF and generating the RF generator control signal to control at least one of power, frequency, or phase of the RF power generator in accordance with the integrated model parameter or the IEDF. The RF power generator is a bias RF generator, and the IEDF varies in accordance with the at least one of the power, frequency, or phase of the bias RF generator. The non-transitory computer-readable medium storing instructions the instructions may include receiving the integrated model parameter, comparing the integrated model parameter with predetermined parameter used to define the model and, revising the predetermined parameter in accordance with the comparison. The integrated model parameter varies in accordance with an ion potential of the plasma. The RF power generator may include a plurality of RF power generators, and the output of the RF power generators is combined and applied to the plasma. The sensed value can be detected at a plurality of positions to obtain the sensed value. The RF output signal is one of a sinusoidal signal, square wave signal, rectangular wave signal, triangular signal, gaussian signal, piecewise linear signal, narrow pulse voltage peak followed by a ramp down signal, or an arbitrary signal. The RF output signal is modulated by a pulse signal. The pulse signal is one of trapezoidal, triangular, gaussian, or arbitrary in shape. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 8A and 8B show waveforms for the sheath potential and the component elements for the sheath current;

In the drawings, reference numbers may be reused to identify similar and/or identical elements.

DETAILED DESCRIPTION

Figure 1:
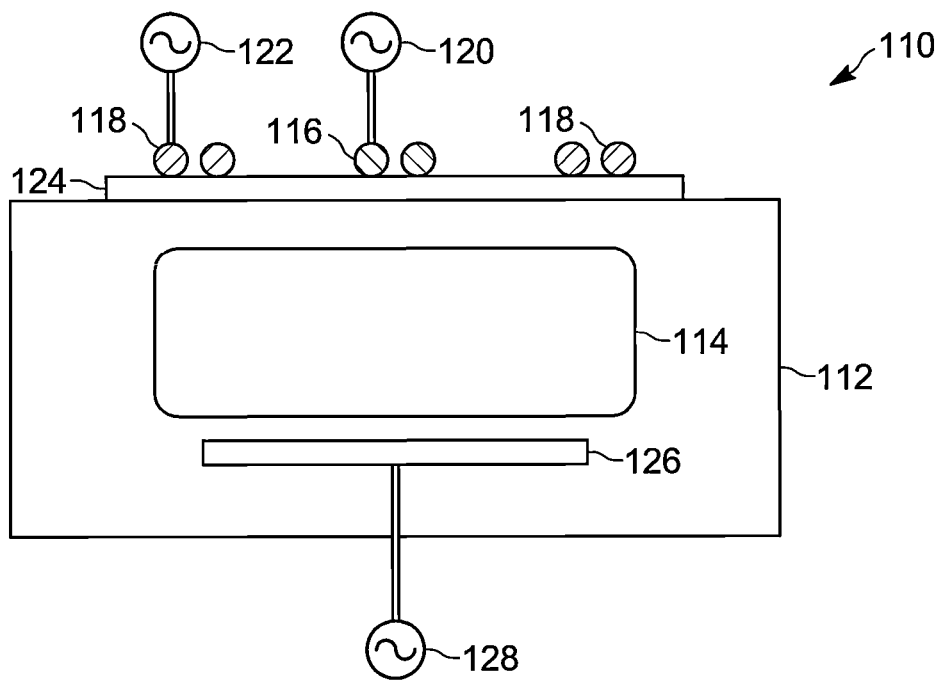
FIG. 1 shows a representation of an inductively coupled plasma system.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized and reverse power may be minimized when the input impedance of the matching network matches the characteristic impedance of the transmission line and generator. In various configurations, there need not be a transmission line between power source and impedance matching unit, and an arbitrary reference characteristic impedance may be established to better suit other aspects of the system. In one non-limiting example, the characteristic impedance may be the output impedance of the power amplifier.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage or potential and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency, and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath potential for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020, and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

In-situ, non-invasive and real-time monitoring of plasma parameters and ion energy distributions (IEDs or IEDFs) has been sought for many years. Plasma parameters and IEDs monitored in real time enable semiconductor tool manufacturers and process engineers to improve the etch or deposition performance of systems. Precise ion energy control facilitates process control for depositing films or etching anisotropic features. Emerging fields such as atomic layer etch (ALE) also requires precise control of ion energies to avoid subsurface damage in accordance with ideal ALE processes. In the case of deposition, various film properties such as stress, refractive index, and density can also be at least partially controlled by varying ion energy.

Existing approaches to monitoring plasma parameters and IED have proposed ways to model ion energies and selected ones have attempted to derive plasma parameters. For example, one approach incorporates a sheath model and derivation of plasma parameters via the use of an invasive sensor in contact with plasma. Invasive sensors, however, inherently disturb the plasma and introduce undesired complexities into the metrology process. Such sensors do not operate with electrically insulating or non-insulating electrodes. Other approaches implement a method of extracting selected plasma parameters at certain points of the RF cycle. However, such approaches are typically based on ion current extraction and not on known plasma parameters. Some approaches also require a non-insulating electrode. No approach contemplates implementing a sensor capable of obtaining non-invasive, real-time measurements, and deriving unknown plasma parameters to control various subsystems of an etch or deposition tool.

The present disclosure describes a non-invasive approach to estimate IEDs and additional plasma properties, such as the bulk plasma density and electron temperature in real-time. These are critical parameters that when used correctly can improve the accuracy of etch and deposition processes.

In various configurations, a RF V/I measurement sensor is positioned at the input of the chamber or post-match. The sensor could be encapsulated in the match or other system component if it represents the same electrical node. Captured data is then processed in a processing processor or module. While other approaches exist for determining plasma properties, the present disclosure contemplates a noninvasive sensor, which provides benefits over conventional invasive measurement techniques. Other non-invasive approaches rely on optical measurements which are not available or feasible to include in production chambers and have limited data rates. Such noninvasive methods are typically experimental and, at best, may be used for calibration, but not for production processing.

The signals generated by the system of the present disclosure are representative of one or more of the plasma density, ion energy, electron temperature, ion energy distribution, or ion velocity at the sheath-plasma interface. Each of these signals can be used to control various aspects of a plasma generation system such as the source and bias generators. For example, the plasma density parameter is used to control the source power and the ion energy peak from the IEDF is used to control bias power. These parameters provide additional insight into the dynamics and evolution of the process.

FIG. 1 depicts a representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage and current is applied to plasma chamber 112 via a pair of coils, including a coil assembly that in various embodiments includes an inner coil 116 and an outer coil 118. Power is applied to inner coil 116 via RF power generator or power source 120, and power is applied to outer coil 118 via RF power generator or power source 122. Coils 116 and 118 are mounted to dielectric window 124 that assists in coupling power to plasma chamber 112. A substrate functions as an electrode 126 in plasma chamber 112 and typically forms the work piece that is the subject of plasma operations. An RF power generator, power supply, or power source 128 (the terms may be used herein interchangeably) applies power to plasma chamber 112 via electrode 126. In various configurations, power sources 120, 122 provide a source voltage or current to ignite or generate plasma 114 or control the plasma density. Also in various configurations, power source 128 provides a bias voltage or current that modulates the ions to control the ion energy or ion density of the plasma 114. In various embodiments, power sources 120, 122 are locked to operate at the same frequency, voltage, and current, with fixed or varying relative phases. In various other embodiments, power sources 120, 122 may operate at different frequencies, voltages, and currents, and relative phases.

Figure 2:
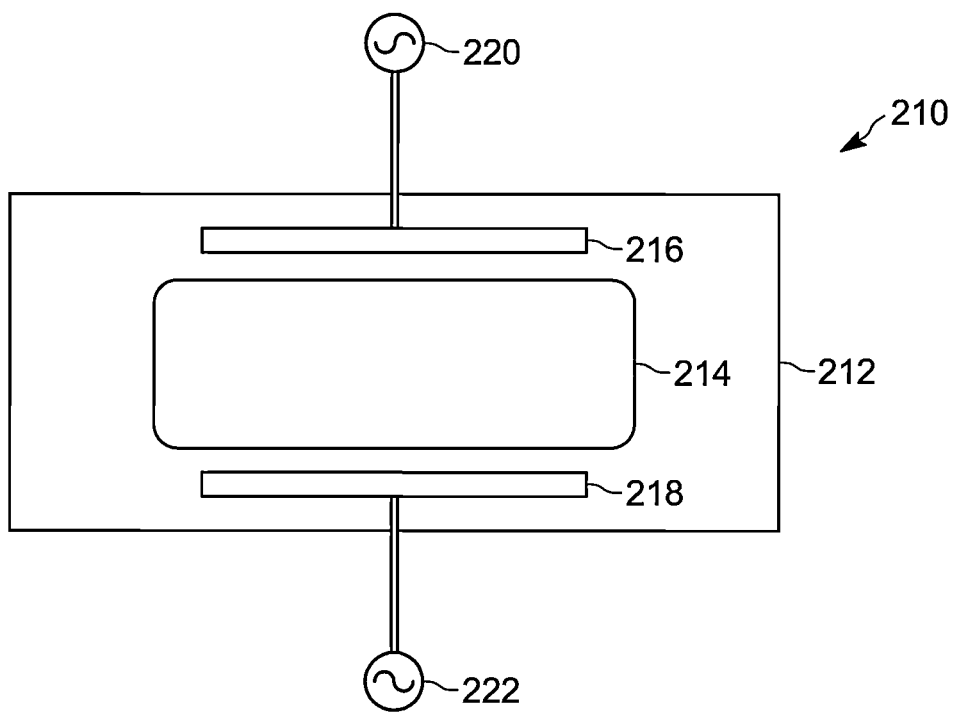
FIG. 2 shows a representation of a capacitively coupled plasma system.

FIG. 2 depicts a representation of a capacitively coupled plasma (CCP) system 210. CCP system 210 includes plasma chamber 212 for generating plasma 214. A pair of electrodes 216, 218 placed within plasma chamber 212 connect to respective DC ($\omega=0$) or RF power generators or power sources 220, 222. In various embodiments, power source 220 provides a source voltage or current to ignite or generate plasma 214 or control the plasma density. In various embodiments, power source 222 provides a bias voltage or current that modulates the ions in the plasma to control the ion energy and/or ion density of the plasma 214. In various RF embodiments, power sources 220, 222 operate at relative phases when the sources are harmonically related. In various other embodiments, power sources 220, 222 operate at different frequencies, voltages, and currents, with fixed or varying relative phases. Also in various embodiments, power sources 220, 222 can be connected to the same electrode, while the counter electrode is connected to ground or to yet a third DC ($\omega=0$) or RF power generator (not shown).

Figure 3:
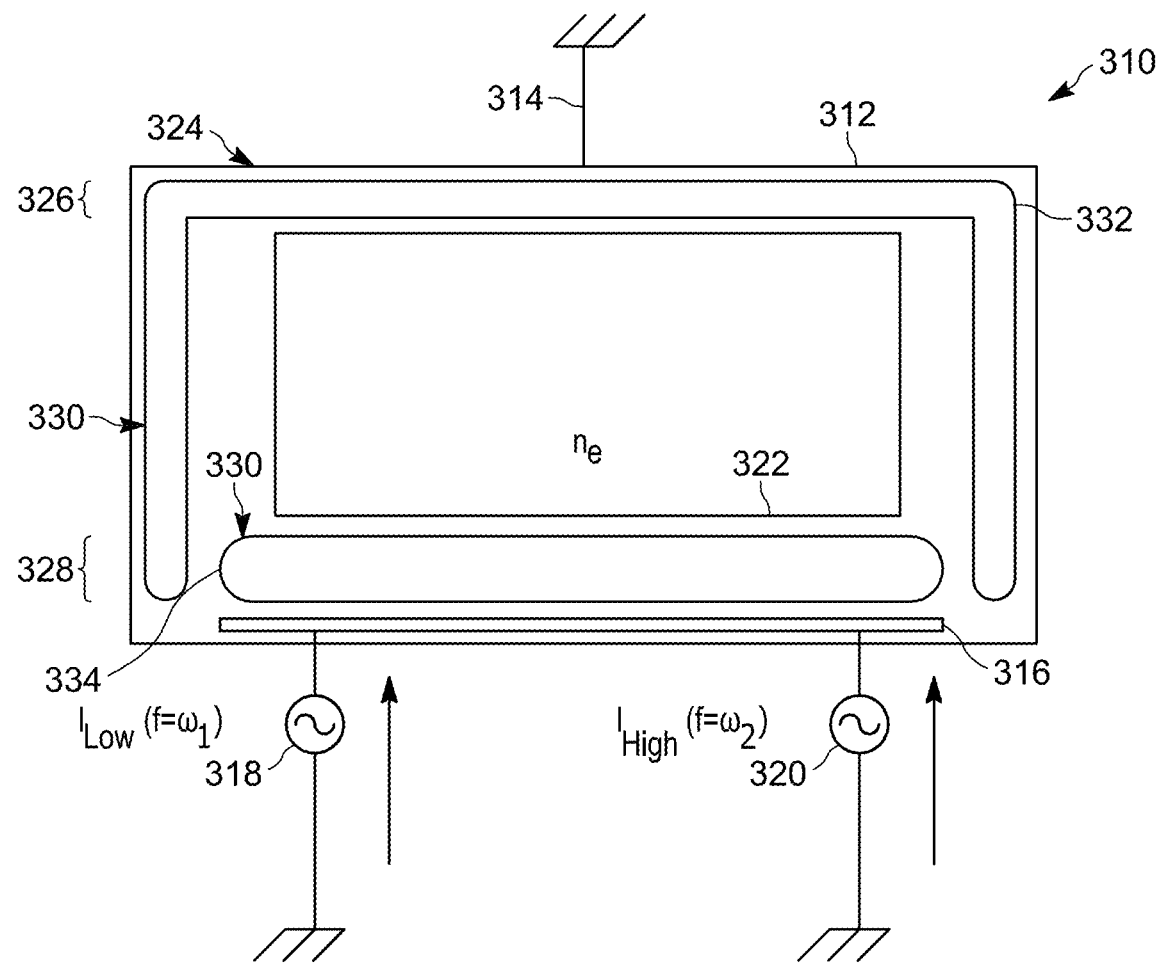
FIG. 3 shows a generalized representation of a plasma system arranged according to various embodiments of the present disclosure.

FIG. 3 depicts a cross-sectional view of a generalized representation of a dual power input plasma system 310. Plasma generation system 310 includes a plasma chamber that functions as a first electrode 312 connected to ground 314 and second electrode 316 spaced apart from first electrode 312. A first DC ($\omega=0$) or RF first power source 318 generates a first RF power applied to second electrode 316 at a first frequency $f=\omega_1$. A second power source 320 generates a second DC ($\omega=0$) or RF power applied to second electrode 316. In various embodiments, second power source 320 operates at a second frequency $f=\omega_2$, where $w_2=n\omega$ that is the $n^{th}$ harmonic frequency of the frequency of first power source 318. In various other embodiments, second power source 320 operates at a frequency (that is not a multiple of the frequency of the first power source 318).

Coordinated operation of respective power sources 318, 320 results in generation and control of plasma 322. As shown in FIG. 3 in schematic view, plasma 322 is formed within an asymmetric sheath 330 of plasma chamber 324. Sheath 330 includes a ground or grounded sheath 332 and a powered sheath 334. A sheath is generally described as a charge depletion region surrounding plasma 322. As can be seen in schematic view in FIG. 3, grounded sheath 332 has a relatively large surface area 326. Powered sheath 334 has a relatively small surface area 328. Because each sheath 332, 334 functions as a dielectric between the conductive plasma 322 and respective electrodes 312, 316, each sheath 332, 334 forms a capacitance between plasma 322 and respective electrodes 312, 316.

Figure 4:
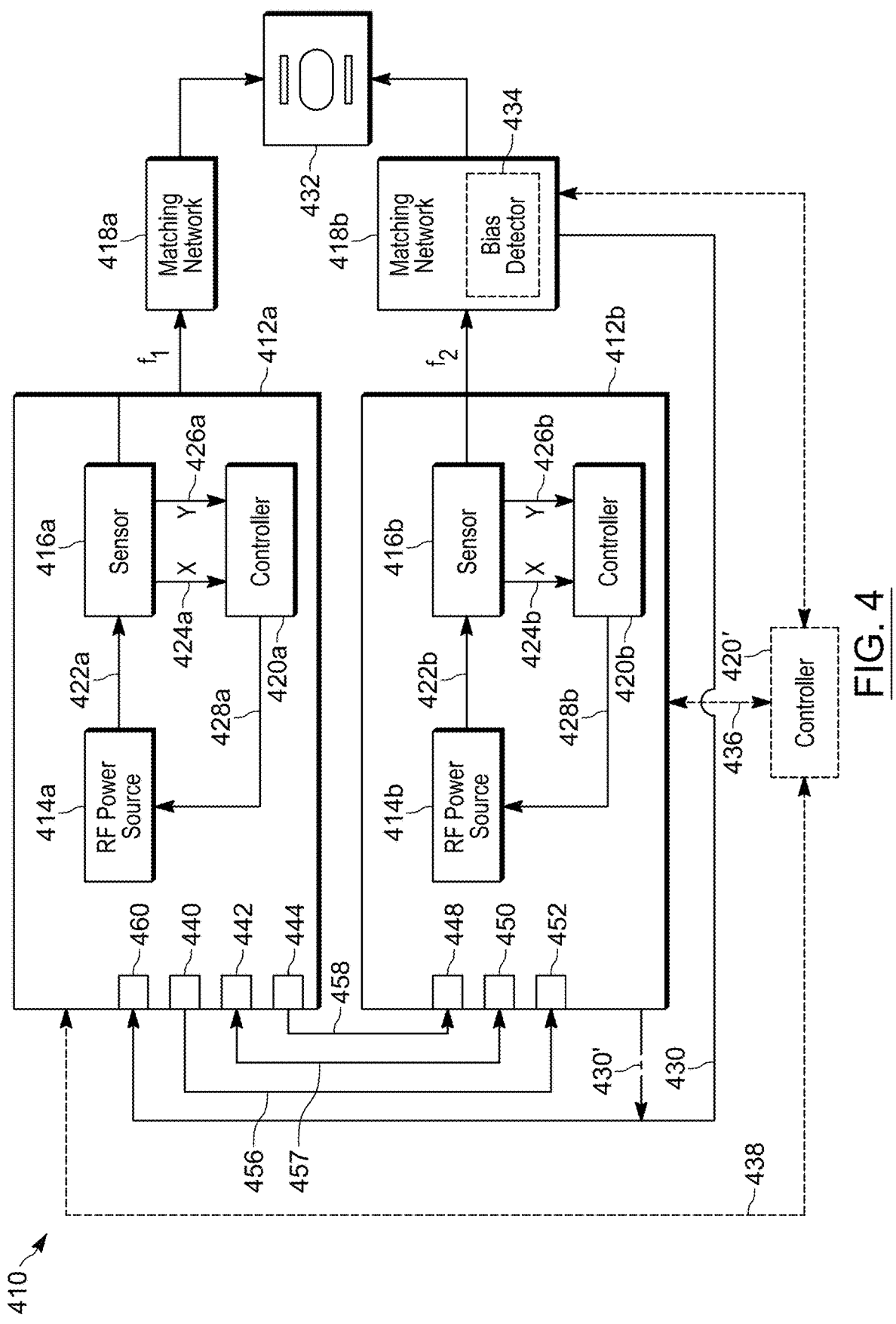
FIG. 4 is a schematic diagram of a power delivery system having multiple power supplies arranged according to various embodiments of the present disclosure.

FIG. 4 depicts a RF generator or power supply system 410. Power supply system 410 includes a pair of radio frequency (RF) generators or power supplies 412a, 412b, matching networks 418a, 418b, and load 432, such as a non-linear load, which may be a plasma chamber, process chamber, and the like. In various embodiments, RF generator 412a is referred to as a source RF generator or power supply, and matching network 418a is referred to as a source matching network. Also in various embodiments, RF generator 412b is referred to as a bias RF generator or power supply, and matching network 418b is referred to as a bias matching network. It will be understood that the components can be referenced individually or collectively using the reference number without a letter subscript or a prime symbol.

In various embodiments, source RF generator 412a receives a control signal 430 from matching network 418b, generator 412b, or a control signal 430' from bias RF generator 412b. As will be explained in greater detail, control signal 430 or 430' represents an input signal to source RF generator 412a that indicates one or more operating characteristics or parameters of bias RF generator 412b. In various embodiments, a synchronization bias detector 434 senses the RF signal output from matching network 418b to load 432 and outputs a synchronization or trigger signal 430 to source RF generator 412a. In various embodiments, synchronization or trigger signal 430' may be output from bias RF generator 412b to source RF generator 412a, rather than trigger signal 430. A difference between trigger or synchronization signals 430, 430' may result from the effect of matching network 418b, which can adjust the phase between the input signal to and output signal from matching network. Signals 430, 430' include information about the operation of bias RF generator 412b that in various embodiments enables predictive responsiveness to address periodic fluctuations in the impedance of load 432 caused by the bias RF generator 412b. When control signals 430 or 430' are absent, RF generators 412a, 412b operate autonomously.

RF generators 412a, 412b include respective RF power sources or amplifiers 414a, 414b, RF sensors 416a, 416b, and processors, controllers, or control modules 420a, 420b. RF power sources 414a, 414b generate respective RF power signals 422a, 422b output to respective sensors 416a, 416b. Sensors 416a, 416b receive the output of RF power sources 414a, 414b and generate respective RF power signals $f_1$ and $f_2$. Sensors 416a, 416b also output signals that vary in accordance with various parameters sensed from load 432. While sensors 416a, 416b, are shown within respective RF generators 412a, 412b, RF sensors 416a, 416b can be located externally to the RF power generators 412a, 412b. Such external sensing can occur at the output of the RF generator, at the input of an impedance matching device located between the RF generator and the load, or between the output of the impedance matching device (including within the impedance matching device) and the load.

Sensors 416a, 416b detect various operating parameters and output signals X and Y. Sensors 416a, 416b may include voltage, current, and/or directional coupler sensors. Sensors 416a, 416b may detect (i) voltage V and current I and/or (ii) forward power $P_{FWD}$ output from respective power amplifiers 414a, 414b and/or RF generators 412a, 412b and reverse or reflected power $P_{REV}$ received from respective matching network 418a, 418b or load 432 connected to respective sensors 416a, 416b. The voltage V, current I, forward power $P_{FWD}$, and reverse power $P_{REV}$ may be scaled, filtered, or scaled and filtered versions of the actual voltage, current, forward power, and reverse power associated with the respective power sources 414a, 414b. Sensors 416a, 416b may be analog or digital sensors or a combination thereof. In a digital implementation, the sensors 416a, 416b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 416a, 416b generate sensor signals X, Y, which are received by respective controllers or power control modules 420a, 420b. Power control modules 420a, 420b process the respective X, Y signals 424a, 426a and 424b, 426b and generate one or a plurality of feedforward or feedback control signals 428a, 428b to respective power sources 414a, 414b. Power sources 414a, 414b adjust the RF power signals 422a, 422b based on received the one or plurality feedback or feedforward control signal. In various embodiments, power control modules 420a, 420b may control matching networks 418a, 418b, respectively, via respective control signals 421a, 421b. Power control modules 420a, 420b may include, at least, proportional integral derivative (PID) controllers or subsets thereof and/or direct digital synthesis (DDS) component(s) and/or any of the various components described below in connection with the modules.

In various embodiments, power control modules 420a, 420b are PID controllers or subsets thereof and may include functions, processes, processors, or submodules. Control signals 428a, 428b may be drive signals and may include DC offset or rail voltage, voltage or current magnitude, frequency, and phase components. In various embodiments, feedback control signals 428a, 428b can be used as inputs to one or multiple control loops. In various embodiments, the multiple control loops can include a proportional-integral-derivative (PID) control loop for RF drive, and for rail voltage. In various embodiments, control signals 428a, 428b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 428a, 428b can provide feedforward control as described in U.S. Pat. No. 10,049,857, assigned to the assignee of the present application and incorporated by reference herein.

In various embodiments, power supply system 410 can include controller 420'. Controller 420' may be disposed externally to either or both of RF generators 412a, 412b and may be referred to as external or common controller 420'. In various embodiments, controller 420' may implement one or a plurality of functions, processes, or algorithms described herein with respect to one or both of controllers 420a, 420b. Accordingly, controller 420' communicates with respective RF generators 412a, 412b via a pair of respective links 436, 438 which enable exchange of data and control signals, as appropriate, between controller 420' and RF generators 412a, 412b. For the various embodiments, controllers 420a, 420b, 420' can distributively and cooperatively provide analysis and control along with RF generators 412a, 412b. In various other embodiments, controller 420' can provide control of RF generators 412a, 412b, eliminating the need for the respective local controllers 420a, 420b.

In various embodiments, RF power source 414a, sensor 416a, controller 420a, and matching network 418a can be referred to as source RF power source 414a, source sensor 416a, source controller 420a, and source matching network 418a. Similarly in various embodiments, RF power source 414b, sensor 416b, controller 420b, and matching network 418b can be referred to as bias RF power source 414b, bias sensor 416b, bias controller 420b, and bias matching network 418b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 412a and bias RF generator 412b include multiple ports to communicate externally. Source RF generator 412a includes a pulse synchronization output port 440, a digital communication port 442, and an RF output port 444. Bias RF generator 412b includes an RF input port 448, a digital communication port 450, and a pulse synchronization input port 452. Pulse synchronization output port 440 outputs a pulse synchronization signal 456 to pulse synchronization input port 452 of bias RF generator 412b. Digital communication port 442 of source RF generator 412a and digital communication port 450 of bias RF generator 412b communicate via a digital communication link 457. RF output port 444 generates a RF control signal 458 input to RF input port 448. In various embodiments, RF control signal 458 is substantially the same as the RF control signal controlling source RF generator 412a. In various other embodiments, RF control signal 458 is the same as the RF control signal controlling source RF generator 412a, but is phase shifted within source RF generator 412a in accordance with a requested phase shift generated by bias RF generator 412b. Thus, in various embodiments, source RF generator 412a and bias RF generator 412b are driven by substantially identical RF control signals or by substantially identical RF control signal phase shifted by a predetermined amount.

Figure 5:
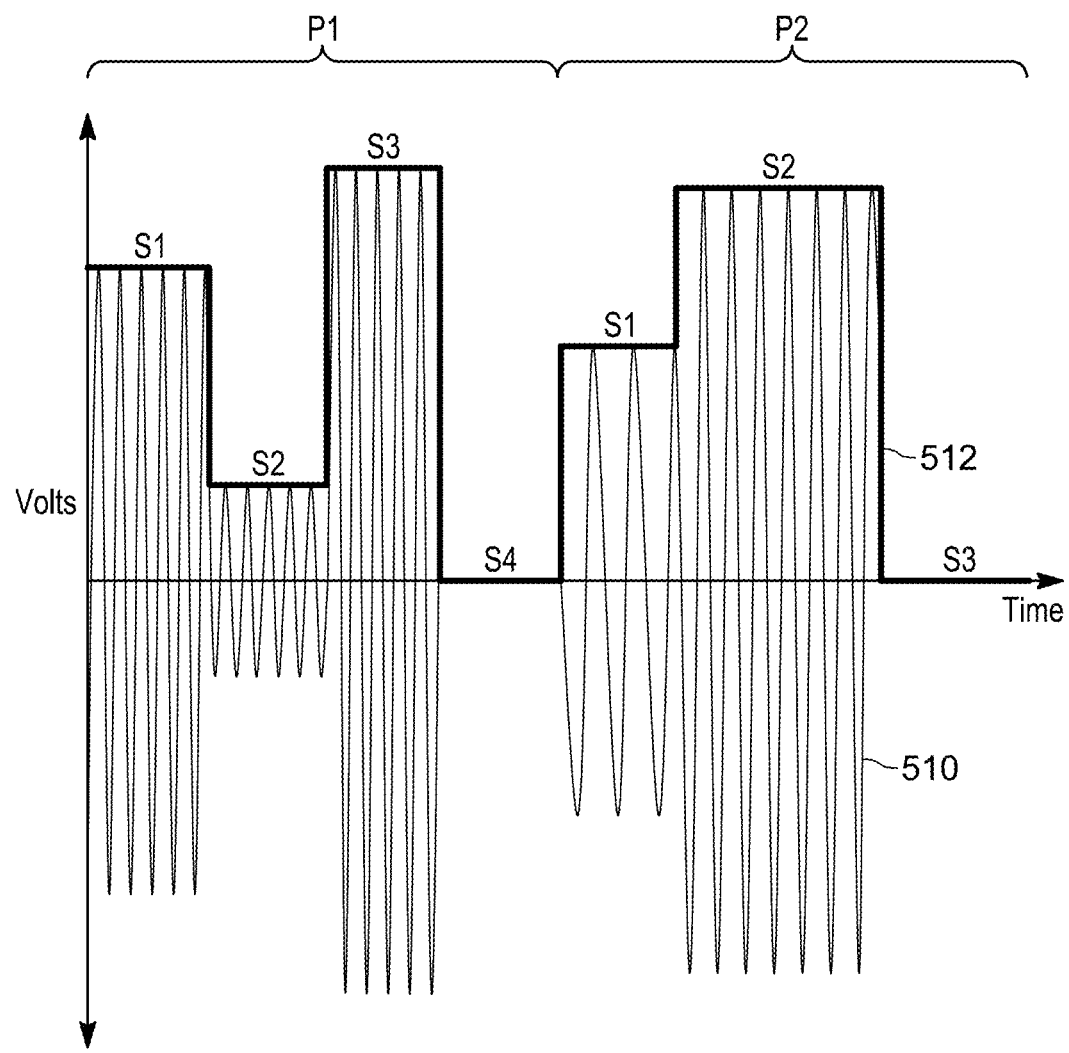
FIG. 5 shows waveforms of a RF signal and a pulse modulating the RF signal.

FIG. 5 depicts a plot of voltage versus time to describe a pulse mode of operation for delivering power to a load, such as load 432 of FIG. 4. More particularly, FIG. 2 depicts two-multistate pulses P1, P2 of a pulse signal 512 having a respective plurality of states S1-S4 and S1-S3. In FIG. 5, RF signal 510 is modulated by pulses P1 and P2. As shown at states S1-S3 of P1 and S1-S2 of P2, when the pulses are ON, RF generator 412 outputs RF signal 510 having an amplitude defined by the pulse magnitude at each state. Conversely, during states S4 of P1 and S3 of P2, the pulses are OFF, and RF generator 412 does not output RF signal 510. Pulses P1, P2 can repeat at a constant duty cycle or a variable duty cycle, and states S1-S4 of each pulse P1, P2 may have the same or varying amplitudes and widths. Further, pulse signal 512 need not be embodied as a rectangular wave as shown in FIG. 5. By way of non-limiting example, pulse signal 512 may be square, rectangular, trapezoidal, triangular, or gaussian in shape. Further yet, pulses P1, P2 can have multiple states S1, . . . , Sn of varying amplitude, duration, and shape. States S1, . . . , Sn may repeat within a fixed or variable period. Also shown in FIG. 5, RF signal 510 operates at a frequency that varies between states or within a state.

Various, advanced plasma processing systems for semiconductor fabrication are approaching atomic scale control during etch and deposition of films. To provide the control precision necessary, it is desirable to have knowledge of representative feedback of important plasma parameters. With improved feedback, process designers can more accurately control actuators to provide the atomic scale control during etch and deposition. In an etch application, for example, improved accuracy can be realized by controlling the energy of ions impacting the substrate to within a few electron volts (eV). Present etch tools typically provide a bias voltage measurement that, desirably, indicate ion energy, but present systems do not provide a sufficiently strong correlation between bias voltage and ion energy.

Figure 6:
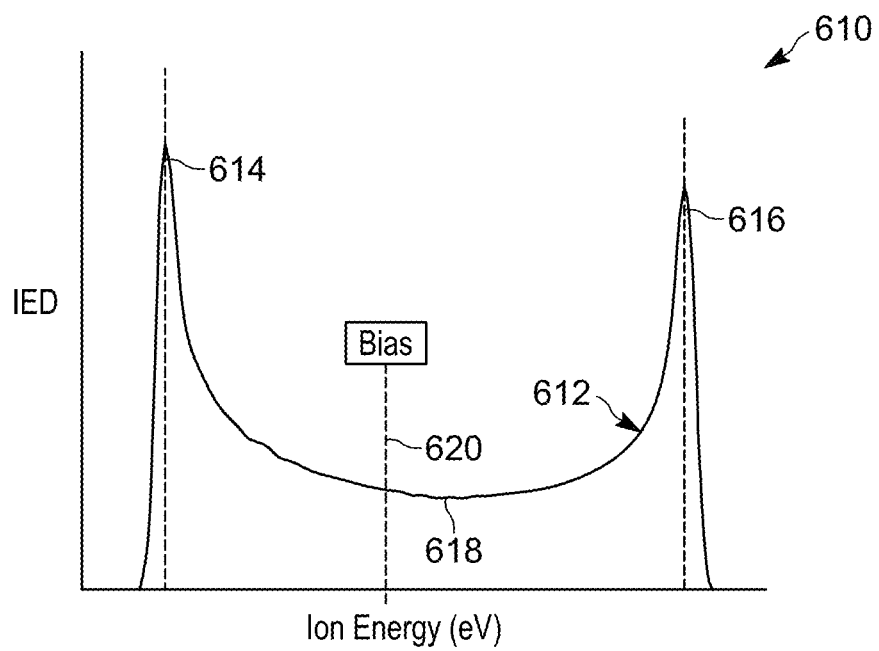
FIG. 6 shows a histogram of the probability of ions that traverse the plasma sheath, having a specific ion energy.

FIG. 6 shows a histogram plot 610 of ion energy (eV) versus ion energy distribution (IED). Histogram 612 has a low energy peak 614, a high energy peak 616, and a trough region 618. A typical bias voltage 620 indicates that ions of a particular energy are impacting the wafer. However, the distribution of ion energies indicates that most ions impact the substrate at higher and lower energies, as shown at low energy peak 614 and high energy peak 616. The present disclosure is directed to, in various configurations, controlling the location of the low energy peak 614 and the high energy peak 616 or providing a single mono-energetic peak.

In various configurations, a mathematical model of a plasma chamber can be used to determine the histogram of FIG. 6 and electrical parameters that determine the histogram of FIG. 6. The sheath potential can be represented by a derivative, wherein the integral of the derivative provides the sheath potential voltage $V_s$. The time dependent derivative of the sheath voltage or sheath potential is described below in equation (1):

$$\frac{dV_s}{dt} = \left(\frac{1}{\varepsilon_0 A}\left(I_p - en_0 e^{-\frac{1}{2}}\sqrt{\frac{k_b T_e}{m_i}} A + \frac{1}{4} en_0 e^{\left(\frac{eV_s}{k_b T_e}\right)}\sqrt{\frac{8k_b T_e}{\pi m_e}} A\right) - \frac{\partial E}{\partial V_i}\frac{dV_i}{dt}\right)\left(\frac{\partial E}{\partial V_s}\right)^{-1} \quad (1)$$

where,
- $I_p$ is the instantaneous sheath current;
- $\varepsilon_0$ the permittivity of free space, also defined above;
- A is the electrode discharge surface area, also defined above;
- e is electron charge, also defined above;
- $k_b$ is the Boltzmann constant;
- $n_o$ is the plasma density;
- $T_e$ is the electron temperature;
- $m_i$ is the ion mass;
- $m_e$ is the electron mass;
- $V_i$ is the instantaneous ion potential; and
- $V_s$ is the instantaneous sheath potential Further, $$\frac{\partial E}{\partial V_s}$$

is a sheath electric field partial derivative and is described in equation (2):

$$\frac{\partial E}{\partial V_s} = \frac{n_0 k_b T_e}{\varepsilon_0 E}\left(\frac{\sqrt{1-\frac{2eV_i}{K_b T_e}} - 1}{\frac{eV_i}{K_b T_e}}\left(1 - e^{\left(\frac{eV_s}{k_b T_e}\right)}\right)\right). \quad (2)$$

The sheath electric field E is described in equation (3):

$$E = \sqrt{\frac{2n_0 k_b T_e}{\varepsilon_0}\left(\frac{\sqrt{1-\frac{2eV_i}{K_b T_e}} - 1}{\frac{eV_i}{k_b T_e}}\right)\left(1 + \frac{eV_s}{k_b T_e} - e^{\left(\frac{eV_s}{k_b T_e}\right)}\right)}. \quad (3)$$

Further, $$\frac{\partial E}{\partial V_i}$$

is a sheath electric field partial derivative is described in equation (4):

$$\frac{\partial E}{\partial V_i} = \frac{n_0 k_b T_e}{\varepsilon_0 E}\left(\frac{\sqrt{1-\frac{2eV_i}{K_b T_e}} - \left(1-\frac{2eV_i}{k_b T_e}\right) - \left(\frac{eV_i}{k_b T_e}\right)}{\frac{eV_i}{k_b T_e}}\left(1 + \frac{eV_s}{k_b T_e} + e^{\left(\frac{eV_s}{k_b T_e}\right)}\right)\right). \quad (4)$$

The time derivative of the ion potential $dV_i/dt$ is described in equation (5):

$$\frac{dV_i}{dt} = \frac{1}{2\pi}\sqrt{\frac{e^2 n_0}{\varepsilon_0 m_i}}(V_i - V_s). \quad (5)$$

The resistance due to ohmic and stochastic heating $R_p$ is described in equation (6):

$$R_p = \frac{m_e}{n_0 e^2 A}\left(X_{en} + |L|^{-1}\sqrt{\frac{k_b T_e}{\pi m_e}}\right) \quad (6)$$

where:
- $X_{en}$ is the electron neutral ion cross-section; and
- L is the length (height) of the active plasma.

The electron inertia $L_p$ is described in equation (7):

$$L_p = \frac{Lm_e}{n_0 e^2 A}. \quad (7)$$

Figure 7:
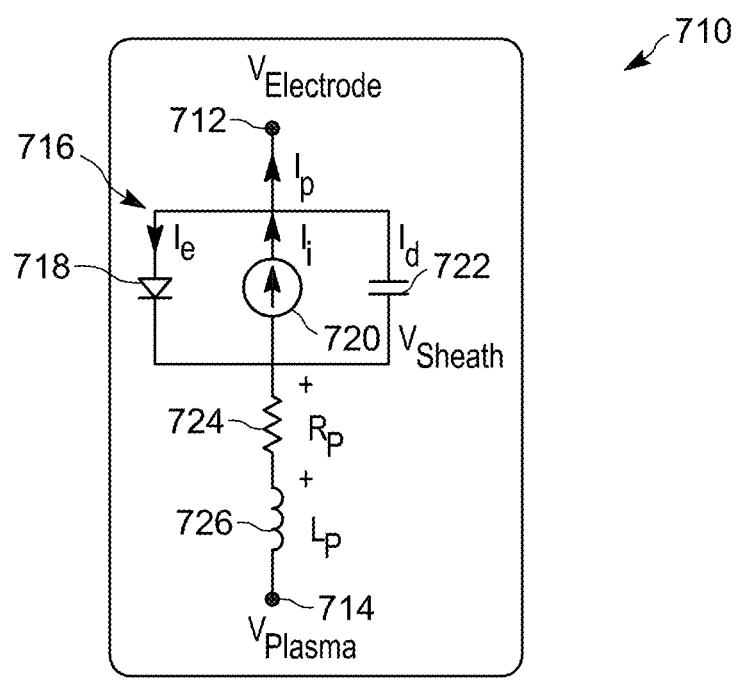
FIG. 7 shows a circuit providing an electrical representation of components of a model according to the present disclosure.

FIG. 7 shows an electrical circuit 710 representative of components of an electrical model of an electrical sheath within a plasma chamber. Electrical circuit 710 includes a first node 712 connected to an electrode of a plasma chamber, such as electrode 126, 218, 316 of FIGS. 1-3. The voltage at the electrode is indicated by $V_{Electrode}$. Electrical circuit 710 includes a second node 714 representing the voltage of the plasma $V_{Plasma}$. A plasma current $I_p$ represents the current flowing through the plasma sheath, as will be described herein. Plasma sheath 716 is further represented by a trio of components, including diode 718, current source 720, and capacitor 722. Sheath potential $V_{Sheath}$ indicates the voltage or potential across plasma sheath 716. An electron current $I_e$ flows through diode 718. Similarly, an ion current $I_i$ flows through current source 720. Further, a displacement $I_d$ current flows through capacitor 722. Resistor 724 represents the effect of ohmic and stoichiometric heating on the plasma and is modeled as $R_P$. Inductor 726 represents electron inertia and is modeled as $L_p$.

From the above equations (1)-(7), electrical characteristics for the various components of FIG. 7 can be determined. For example, plasma current $I_p$ into first node 712 is described in equation (8):

$$I_p = \qquad (8)$$

$$en_0 e^{-\frac{1}{2}} \sqrt{\frac{k_b T_e}{m_i}} A - \frac{1}{4} en_0 e^{\left(\frac{eV_s}{k_b T_e}\right)} \sqrt{\frac{8k_b T_e}{\pi m_e}} A + \varepsilon_0 \left(\frac{\partial E}{\partial V_s} \frac{dV_s}{dt} + \frac{\partial E}{\partial V_i} \frac{dV_i}{dt}\right) A.$$

Ion current $I_i$ though current source 720 is described in equation (9):

$$I_i = en_0 e^{-\frac{1}{2}} \sqrt{\frac{k_b T_e}{m_i}} A. \qquad (9)$$

Electron current $I_e$ through diode 718 is described in equation (10):

$$I_e = \frac{1}{4} en_0 e^{\left(\frac{eV_s}{k_b T_e}\right)} \sqrt{\frac{8k_b T_e}{\pi m_e}} A. \qquad (10)$$

Sheath displacement current $I_d$ is described in equation (11):

$$I_d = \varepsilon_0 \left(\frac{\partial E}{\partial V_s} \frac{dV_s}{dt} + \frac{\partial E}{\partial V_i} \frac{dV_i}{dt}\right) A. \qquad (11)$$

FIGS. 8A and 8B show waveforms for selected values for the electrical representation of FIG. 7. Waveform 812 of FIG. 7 shows the sheath potential or sheath voltage of the electrical representation of FIG. 7. Waveform 812 represents the integral of equation (1), which must be resolved iteratively, since no closed form solution exists to equation (1). FIG. 8B shows the component currents of sheath 716 of FIG. 7. Waveform 814 shows the ion current $I_i$; waveform 816 shows the electron current $I_e$; and waveform 818 shows the displacement current $I_d$.

Figure 9:
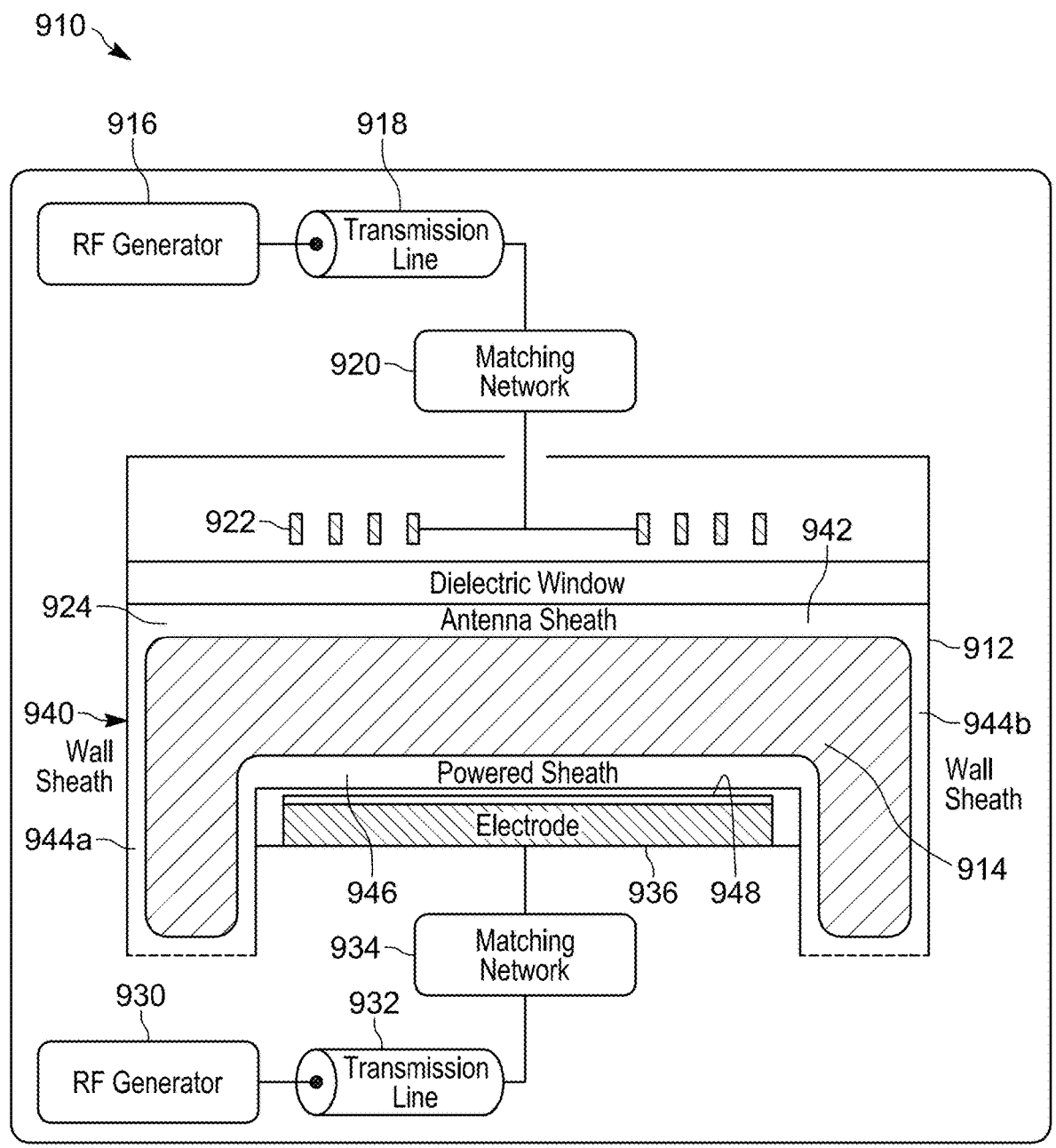
FIG. 9 shows a plasma chamber and driving RF generators for describing a plasma generation model of the present disclosure.

FIG. 9 shows plasma generation system 910, which will be used to further describe the noninvasive sensor of the present disclosure. FIG. 9 includes plasma chamber 912 in which a bulk plasma 914 is generated. By applying a source power at a predetermined power and frequency, a bulk plasma is ignited. Further, by applying a bias power at a predetermined power and frequency, ion energy for ions crossing the sheath 946 can be controlled in order to direct ions onto wafer 948 in order to fabricate semiconductor devices on wafer 948. One parameter that can be controlled by the bias power is the energy of the ions that impinge on the substrate. This ion energy is commonly represented by a distribution referred to as the IED.

Bulk plasma 914 is generated by application of a power output by RF generator 916. The RF power is applied to matching network 920 via transmission line 918. Matching network 920 provides an impedance match between RF generator 916 and plasma chamber 912, which acts as a load to RF generator 916. The output of matching network 920 is applied to antenna 922, and excitation of antenna 922 applies a power to the interior of the plasma chamber 912 via dielectric window 924. RF generator 916 may be referred to as a source RF power supply, since the power provided by RF source generator ignites bulk plasma 914. Power from RF generator 916 is coupled to plasma chamber 912 via antenna 922. Thus, antenna 922 provides an inductive coupling between RF generator 916 and plasma chamber 912, and the connection is referred to as an inductively coupled plasma, (ICP).

A second RF generator 930 provides RF power to plasma chamber 912 via transmission line 932 and matching network 934. Transmission line 932 and matching network 934 operate similarly to respective transmission line 918 and matching network 920. The output from matching network 934 is applied to electrode 936 supporting a workpiece or wafer (not shown). RF generator 930 provides a bias RF power to a powered electrode, such as 220, 222, 316 of respective FIGS. 2 and 3, in order to control the ion voltage or ion potential and related IED, thereby directing ions onto wafer 948. Since the RF power output by RF generator 930 is applied to plasma chamber 912 via electrode 936, this arrangement is referred to as a capacitively coupled plasma (CCP).

Bulk plasma 914 is surrounded by a sheath 940 that includes a plurality of segments. Sheath 940 includes an antenna sheath 942 shown at the top of bulk plasma 914 between bulk plasma 914 and dielectric window 924. A wall sheath 944a, 944b borders the sides and bottom of plasma 914 between bulk plasma 914 and the outer wall of plasma chamber 912. A powered sheath or electrode sheath 946 is located between bulk plasma 914 and wafer 948. With reference to FIG. 7, an individual component, such as one of components 942, 944a, 944b, and 946 may be represented electrically as shown FIG. 7.

Figure 10:
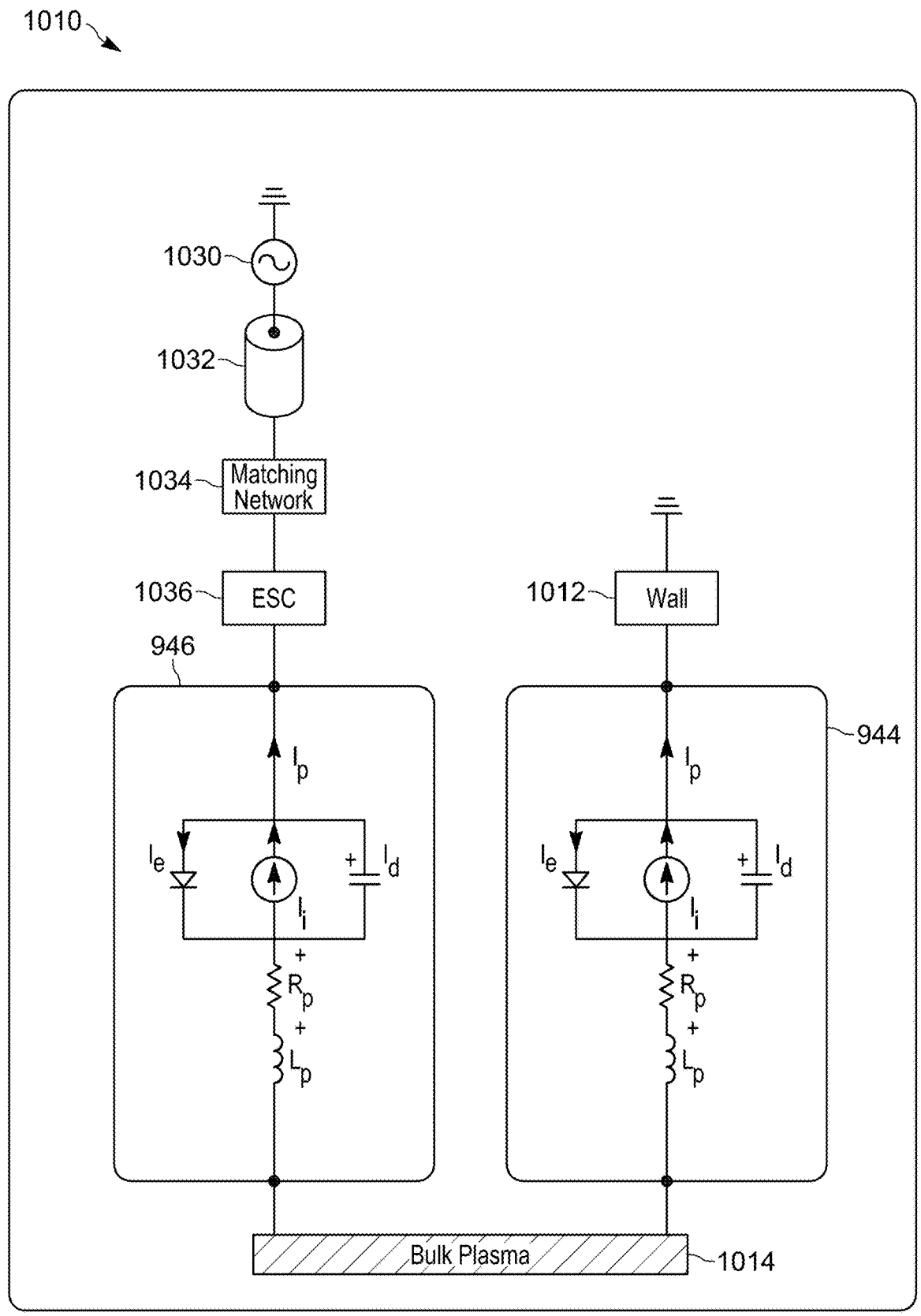
FIG. 10 shows a circuit providing an electrical representation of components of a model of the plasma chamber according to the present disclosure.

FIG. 10 shows a circuit 1010 that provides an electrical representation of a portion of the plasma generation system 910 of FIG. 9. Similar components from FIG. 9 will be shown in FIG. 10 with a reference number preceded by "10", rather than "9". Circuit 1010 includes RF generator 1030 providing a RF power signal to transmission line 1032 and matching network 1034. As shown in FIG. 10, RF generator 1030 provides a bias signal to electrode or electrostatic chuck 1036. Electrostatic chuck 1036 connects to powered sheath or electrode sheath 946. Electrode sheath 946 is configured similarly to electrical circuit 710 of FIG. 7, but it should be understood that the component values can differ for each representation of an element of the model. Electrode sheath 946 connects to bulk plasma 1014. In FIG. 10, wall sheath 944 of FIG. 9 is configured similarly to electrical circuit 710 of FIG. 7. Wall 1012 connects to ground and also connects to wall sheath 944. Wall sheath 944 connects to bulk plasma 1014.

Figure 11:
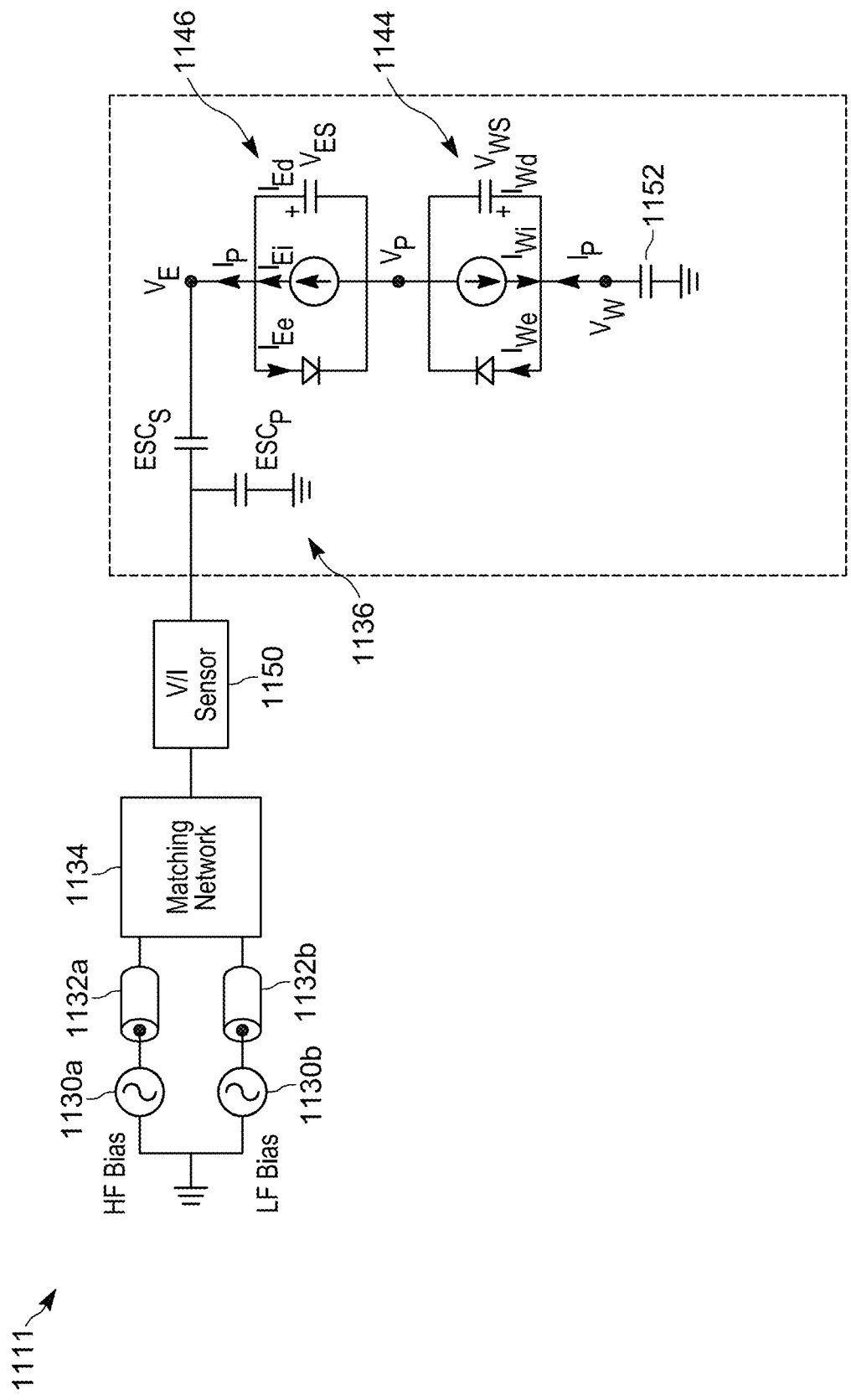
FIG. 11 shows a circuit providing an electrical representation of components of a model of the plasma chamber and including a pair of RF generators applying power to the match network according to the present disclosure.

FIG. 11 shows another representation of a portion of a RF plasma generation system 1111. The RF plasma generation system 1111 includes a pair of RF power generators 1130a, 1130b, implemented as a pair of bias RF power generators. RF power generator 1130a implements a high frequency RF power generator providing high frequency bias power, and RF power generator 1130b implements a low frequency RF power generator providing a low frequency bias power. Respective RF power generators 1130a, 1130b may be operated to provide a desired ion potential and corresponding IED in accordance with various design considerations. Each RF power generator 1130a, 1130b, outputs RF power to respective transmission line 1132a, 1132b. The output from respective transmission lines 1132a, 1132b is input to matching network 1134. Matching network 1134 combines the respective RF powers and outputs a signal to V/I sensor 1150, which may be implemented as any of the sensors described above, including a directional coupler. Further, in various configurations, sensor 1150 may be disposed throughout varying locations in FIG. 11 so that sensor 1150 detects a preselected parameter from which a model of the plasma can be constructed. Sensor 1150 outputs a sensed value that varies in accordance with a state of the plasma. The output from the V/I sensor 1150 is applied to electrostatic chuck 1136 represented as a pair of capacitors, including a series capacitor $ESC_s$ and a parallel capacitor $ESC_p$. Series capacitor $ESC_s$ connects to powered or electrode sheath, represented as 1136. The potential at the node connecting electrostatic chuck 1136 and powered or electrode sheath 1146 is indicated as $V_E$. Powered or electrode sheath 1146 connects to wall sheath 1144, and the node between powered or electrode sheath 1146 and wall sheath 1144 is represented as potential $V_P$. Wall sheath 1144 also connects to ground via capacitor 1152 at a wave having a wall potential $V_W$. The current flowing through powered or electrode sheath 1146, wall sheath 1144, and capacitor 1152 is indicated as $I_p$.

While FIG. 11 shows a pair of sheath voltages or sheath potentials, it will be recognized that a model can be constructed with one or more sheath potentials. A greater number of sheath potentials in the model may improve accuracy of the model but will require additional computational overhead in computing the model.

Figure 12:
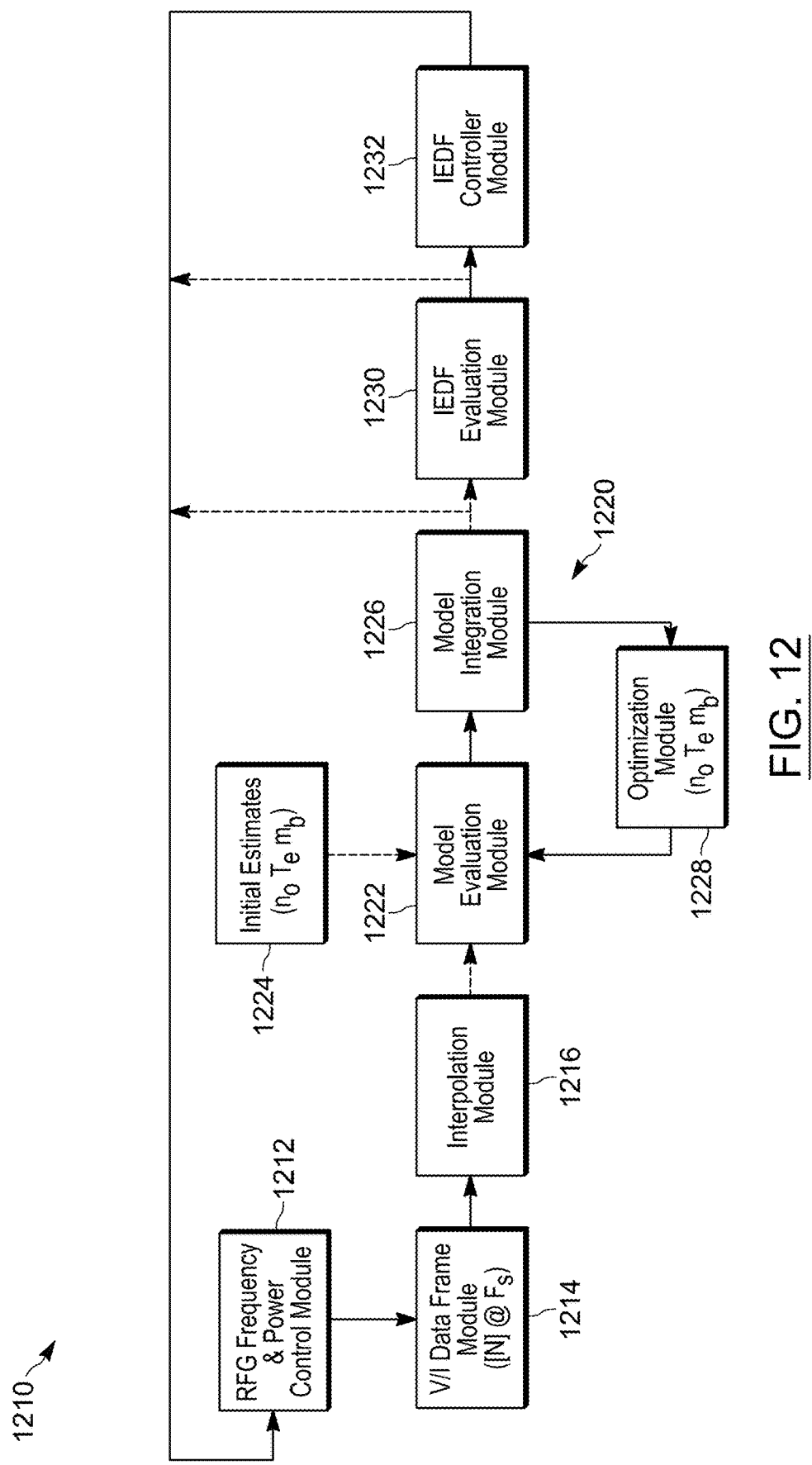
FIG. 12 is a block diagram of a plasma generation model arranged in accordance with the present disclosure.

FIG. 12 shows a plasma control system or control system 1210 for an RF power generation system, such as one or more of the RF power generation systems described above. In various configurations, control system 1210 can be configured to control RF power generators 1130a, 1130b of FIG. 11. In various other configurations, control system 1210 of FIG. 12 can be configured to control a single, a pair, or multiple RF power generators that generate one or more RF power signals for process control of a plasma chamber. The controller RF generators may be bias RF generators in various other configurations, control system 1210 can be configured to control a RF power generator connected to a plasma system in either an ICP or CCP configuration.

Control system 1210 includes a RF generator control module or RF generator frequency and power control module 1212 which outputs a control signal to control one or more of power, frequency, or phase of one or more RF generators to be controlled. The RF power signal output by the controlled RF power generator is detected via a sensor, such as a V/I sensor or a directional coupler as described above. Sensor 1150 outputs a sensed value that varies in accordance with a state of the plasma. The output of the sensor is input to data frame module 1214, which samples the output from the sensor at a predetermined sampling frequency. Thus, data frame module 1214 provides a data processing scheme for measuring voltage and current.

Data frame module 1214 outputs sampled data to interpolation module 1216. Interpolation module 1216 receives the sampled data and generates intermediate data points between the sampled points in order to provide sufficient resolution for modeling operation of the plasma. In various configuration, the voltage and current measurements may be interpolated to adjust for model nonlinearities. Further, in various configurations, block processing, such as for a few RF cycles, of data allows frequency domain interpolation and integration of the sheath model to allow settling of the system. While in some configurations, interpolation may distort endpoints, it is possible to adjust to endpoint distortion by discarding an RF cycle from one or both ends of each block. Interpolated data is output to model evaluation module 1222.

Model evaluation module 1222 receives the sampled data and also receives initial estimates of one or more preselected values, such as $n_o$ and $T_e$. Model evaluation module 1222 performs computations to model the behavior of selected portions of the plasma system, such as in accordance with equations (1)-(7), above. Model evaluation module 1222, in various configurations, implements a method to extract fundamental plasma properties such as plasma density $n_o$ and electron temperature $T_e$. A nonlinear regression or system identification method, non-limiting examples of which include Newton-Raphson or Secant method regression approaches, can be implemented to find the roots of three non-linear equations at a given time within the RF cycle. These equations are derived from the sheath model and are functions which depend on the unknown quantities to be found, $n_o$ and $T_e$. Other non-linear fitting schemes could also be implemented.

Model evaluation module 1222 outputs various model parameters to model integration module 1226. Model evaluation module 1222 also receives input from optimization module 1228. Optimization module 1228 receives feedback from model integration module 1226 and compares the value of various parameters and determines whether preselected parameters, such as such as $n_o$ and $T_e$, have been properly selected, after initialization with initial estimates 1224, or should be adjusted to improve optimization of the model. The adjusted, preselected parameters, such as such as $n_o$ and $T_e$, are fed back to model evaluation module 1222. The values measured by the sensor, and other parameters derived from the integration of the sheath model, are used to evaluate the set of equations that make up the model. A process to search for these data points over the RF cycle is executed by detecting, for example, zero crossings or min/max values within certain characteristic time periods of the sheath potential and current waveforms.

Model integration module 1226 integrates selected parameters of the module to improve accuracy of the same. Model integration module 1226 outputs integrated parameters or integrated model values to IEDF evaluation module 1230. An iterative process continuously integrates the sheath model, performs Newton or Secant method to find unknown plasma parameters ($n_o$, $T_e$), and provides newly computed plasma parameters to sheath model 1220 for a block of data that may include a plurality or more of RF cycles. This process repeats for the same block of data until the unknown plasma parameters converge to within a preselected tolerance. The last integration of the sheath model contains the waveforms to be used for IEDF computation and general parameter extraction. This iteration may be performed on every block of data or selected blocks of data. In various configurations, selected combinations of values may cause mathematical models provide undesired results, including infinite, divide by zero, or complex values. Accordingly, a process may be established to address these situations.

Model integration module 1226 outputs, among other values, an effective ion potential or effective ion voltage which is representative of the sheath potential presented in a dampened sinusoidal waveform. IEDF evaluation module 1230 receives the modeled data and generates output values or signals in accordance with the modeled data. In one configuration, IEDF evaluation module 1230 outputs a histogram indicating the IEDF, such as in FIGS. 6 and 14, for the plasma being modeled. In this instance, the IEDF output by IEDF evaluation module 1230 may be based upon the effective ion potential signal output by model integration module 1226. IEDF evaluation module 1230 outputs the IEDF to IEDF controller module 1232. IEDF controller module 1232 generates signals for controlling one or more of power, frequency, or phase of the RF power generator or RF power generator to be controlled in order to vary the IEDF.

As shown in FIG. 12, output from IEDF controller module 1232 is fed back to RF frequency and power control module 1212. The signals for controlling one or more of power, frequency, or phase of the RF power generator output by IEDF controller module 1232 may be command signals upon which RF generator frequency and power control module 1212 generates actuator signals or, in various configurations, maybe be direct actuator signals.

In various configurations, a control approach may rely on derived parameters such as $n_o$, $T_e$, and IEDF, or other parameters, to control specific systems or subsystems of the etch/deposition tool. For example, plasma density, $n_o$ is strongly dictated by source power in ICP systems. Thus, ICP RF source power can be controlled to maintain a given $n_o$ during processing an as the system ages over process cycles. In CCP systems plasma density is primarily influenced by high frequency generator power, in a dual frequency generator configuration, so it is possible to control this power using $n_o$. The IEDF peaks can be used to maintain a given ion energy by controlling bias RF power of a continuous wave or pulsed RF generator or a pulsed DC generator. The characteristic shape of the IEDF can also be adjusted by controlling the power, frequency, and/or phase, and pulsing of one or multiple RF generators or by shaping a pulsed DC waveform. The output from the IEDF controller module 1232 provides real time feedback to facilitate this control scheme.

While the above description of FIG. 12 describes generation of control signals by IEDF controller module 1232, in various configurations, RF generator frequency and power control module 1212 can be configured to generate one or more of power, frequency, or phase controls in accordance with one or both of the output from model integration module 1226 or IEDF evaluation module 1230. Thus, the effective ion potential signal output by model integration module 1226 can be fed back to RF generator frequency and power control module 1212. Likewise, the IEDF output by IEDF evaluation module 1230 may also be fed back to RF generator to frequency and power control module 1212. Thus, control system 1210 of FIG. 12 provides multiple options for controlling RF power generators by feeding back to RF generator frequency and power control module 1212 one or multiple signals output in accordance with operation of the model.

The modules of the above-described FIG. 12 are shown as executing discrete portions of the plasma control process. However, it should be understood that the above-described modules of control system 1210 may be implemented discretely as shown or may be combined collectively or distributively throughout one or multiple control modules, functions, and processors of a control system 1210 and the underlying plasma control system, such as showing in FIG. 4. Likewise, subsystems of plasma control systems may be collectively or distributively implemented. Thus, the control system 1210 described in FIG. 12 may be implemented to noninvasively sense the ion energy for ion potential and model the IEDF for control of a RF power generator. For example, the bias RF generators described herein, such as shown in at least FIG. 4, may be controlled to the noninvasive sensor and model to generate an ion energy or ion potential and an IEDF.

In various configurations, control system 1210 of FIG. 12 can include a RF frequency and power control module 1212 that generates control signals for actuators or actuator signals to vary the output of one or a plurality of RF generators, such as a bias RF generator described above with respect to FIG. 4 or RF generators 1130a, 1130b of FIG. 11. The output from the one or plurality of RF generators may include, in various non-limiting examples, an output signal, such as a sinusoidal signal, square wave signal, rectangular wave signal, triangular signal, gaussian signal, or piecewise linear signal. In various other configurations, the output signal from the one or plurality of RF generators may have a complex shape including a narrow pulse voltage peak followed by a ramp down in the voltage, an example of which may be found with respect to U.S. Pat. No. 6,201,208, issued Mar. 13, 2001 and entitled Method and Apparatus for Plasma Processing with Control of Ion Energy Distribution at the Substrates, incorporated by reference herein. In various other configurations, the output from the one or plurality of RF generators may have an arbitrary shape variable from cycle to cycle. In other various configurations, the output signal may be periodic or non-periodic. Thus, the RF generators described above with respect to FIG. 4 may be implemented, in various non-limiting examples, a direct digital synthesizer (DDS) configured to generate any of the above-described waveforms.

In various configurations, RF generator frequency and power control module 1212 may be configured to control one or plurality of bias RF generators, such one or a pair of RF generators 1130a, 1130b of FIG. 11. In one nonlimiting example, such as were control module 1212 controls a pair of bias RF generators, the pair of RF generators may be one or both of harmonically or phase related. In various other configurations, RF generator frequency and power control module 1212 may generate actuator control signals or actuator signals to modulate the output signals describe the above using pulses as described above with respect to FIG. 5. In various embodiments, the pulse signal may be embodied as a square wave or rectangular wave as shown in FIG. 5. By way of nonlimiting example, the pulse signal may be trapezoidal, triangular, or gaussian in shape. Further yet, as described above, the modulating signal may have pulses P1, P2 that include multiple states S1, . . . , Sn of varying amplitude, duration, and shape. States S1, . . . , Sn may repeat within a fixed or variable period. Also as described above with respect to FIG. 5, the output signal may have a variable frequency, amplitude, or shape that varies between states or within a state.

In various configurations, plasma control system or control system 1210 can generate signals that describe plasma or electrical parameters useful for controlling other generators in a plasma generation system, such as RF generator 412a, which may be referred to as a source RF generator. In various configurations, RF generator 412a may be operated in a blanking or amplitude modulation mode in which various source voltages are applied during selected regions of a bias voltage cycle. In one nonlimiting example, in a predetermined region, such as a negative cycle of a bias voltage, RF generator 412 a is activated to output a predetermined voltage. During periods other than the predetermined regions of the bias voltage cycle, the voltage output by RF generator 412a a may be reduced or turned off (blanked), reducing the source power applied over the corresponding region of the bias cycle. An example of such an application can be found with respect to U.S. Pat. No. 11,158,488, issued Oct. 26, 2021, and entitled High Speed Synchronization of Plasma Source/Bias Power Delivery, assigned to the assignee of the present application and incorporated by reference herein.

Figure 13A:
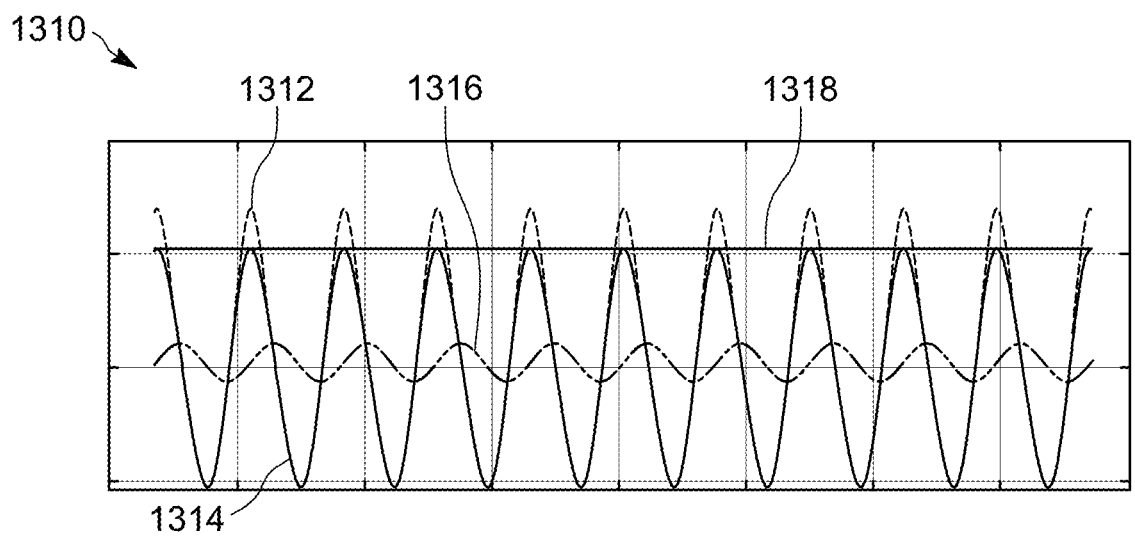
FIGS. 13A, 13B, 13C, and 13D show waveforms representing various parameters of the model in accordance with the present disclosure.

FIGS. 13A, 13B, 13C, 13D show waveforms for an exemplary plasma control system, such as control system 1210. FIG. 13A includes plots of multiple waveforms 1310. Waveforms 1310 show voltage measurements with respect to time. The waveforms include RF voltage $V_{RF}$ 1312, such as may be output by the RF power generator. In various configurations, the RF power generator can be one or a plurality of bias RF generators. The one or plurality of bias RF generators output RF voltage 1312. In various configurations, RF voltage 1312 may result from a single RF generator or may represent a composite output of a plurality of RF generators measured by a sensor, such as V/I sensor or a directional coupler. Waveform 1314 shows the electrode voltage $V_E$ and also the electrostatic chuck voltage $V_{ESC}$. In a particular example, electrode voltage $V_E$ and the electrostatic chuck voltage $V_{ESC}$ are substantially the same, and therefore, only one waveform 1314 is shown. Waveform 1316 shows the ion energy, or ion voltage or ion potential, and may be referred to as the effective ion potential $V_{EL}$. Waveform 1318 shows the plasma voltage $V_P$.

Figure 13B:
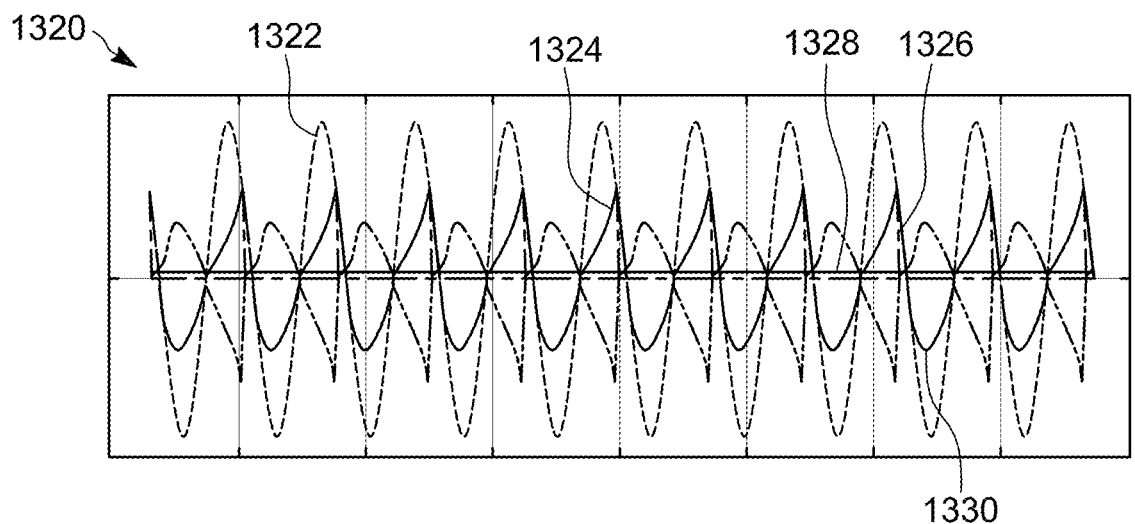
Figure 13C:
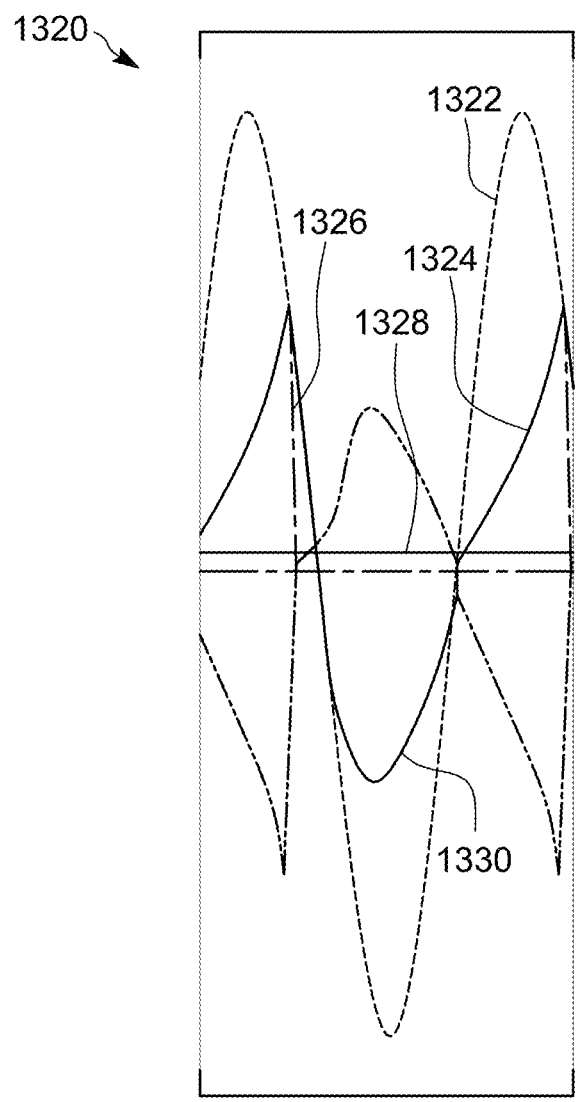

In FIGS. 13B and 13C, waveforms 1320 indicate current values with respect to time corresponding to waveforms 1310 of FIG. 13A. FIG. 13C shows an expanded view of a single cycle of the waveforms of FIG. 13B. The waveforms include RF current waveform $I_{RF}$ 1322 output by the RF power generator. As described above, in various configurations, the RF power generator can be one or a plurality of bias RF generators. The one or plurality of bias RF generators output RF current waveform 1322. In various configurations, RF current waveform 1322 may result from a single RF generator or may represent a composite output of a plurality of RF generators measured by a sensor, such as V/I sensor or a directional coupler. Waveform 1324 is the plasma current $I_p$. Waveform 1326 is the electron chuck current $I_e$. Waveform 1328 is the ion current $I_i$. Waveform 1330 is the displacement current $I_d$. Waveform 1324, the plasma current $I_p$, is a composite of individual waveforms 1326, electron current $I_e$, 1328, ion current $I_i$, and 1330, and displacement current $I_d$.

Figure 13D:
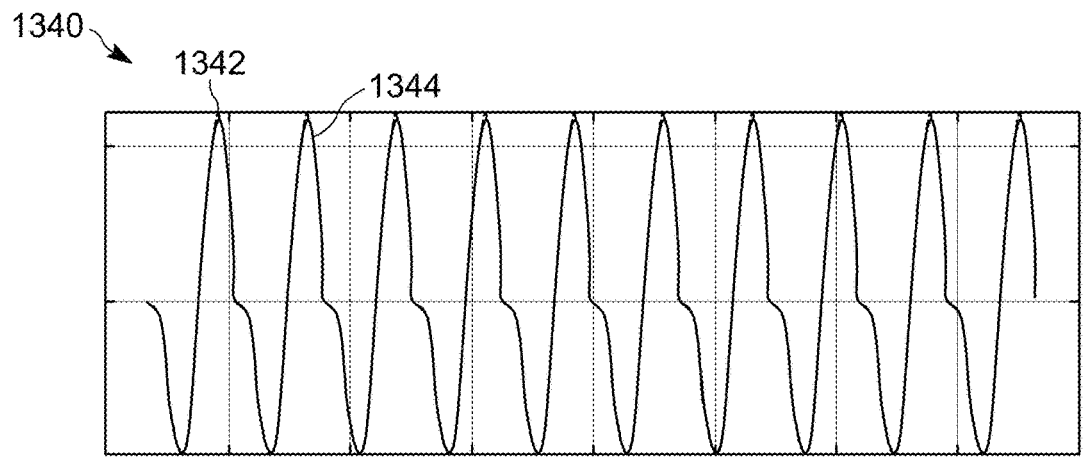

In FIG. 13D, waveforms 1340 show derivatives of selected parameters. In particular, waveform 1342 shows a derivative of the powered electrode or electrostatic chuck potential $dV_E/dt$. Similarly, waveform 1344 shows a derivative of the plasma sheath potential $dV_{ESC}/dt$. It should be noted that the waveforms have substantially the same character when model parameters such as $n_o$ and $T_e$ are correctly determined or fitted by the model.

Figure 14:
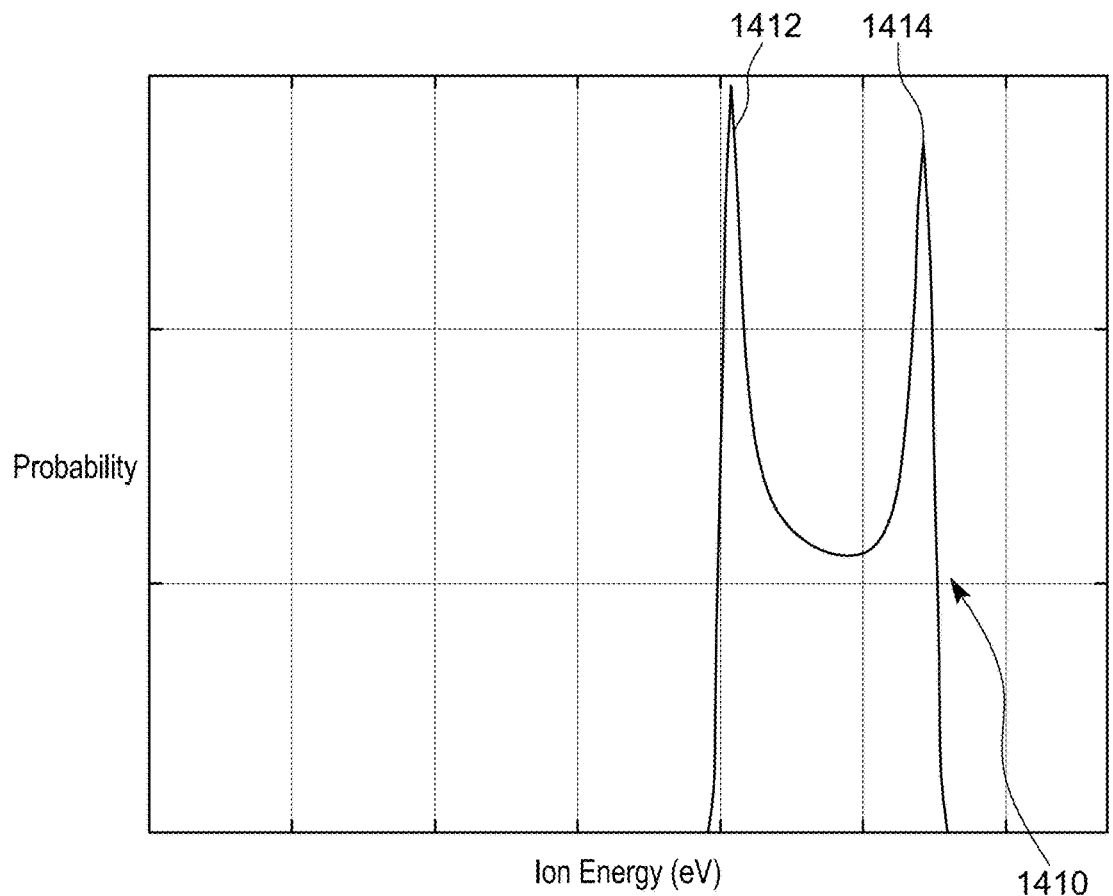
FIG. 14 shows an example histogram that can be output using the noninvasive sensor and model in accordance with the present disclosure.

FIG. 14 shows a histogram 1410 that plots the ion energy versus the probability of a particular ion energy occurring, thereby defining the IEDF. The histogram 1410 of FIG. 14 includes a low energy peak 1412 and a high energy people 1414. The histogram 1410 of FIG. 14 can be generated using the sheath potential waveform 1316 of FIG. 13A. Accordingly, by employing a model which yields the effective ion potential, defining the ion potential or ion energy of the plasma, a histogram, such as in FIG. 14 can be developed. Further, by modeling the effective ion potential, it is possible to determine existing energy peaks in the histogram. Further, by adjusting various control parameters, such as power, frequency, or phase of the RF power generator, such as a bias RF power generator, the location of the peaks of the IEDF can be determined or a mono-energetic peak can be generated.

Figure 15:
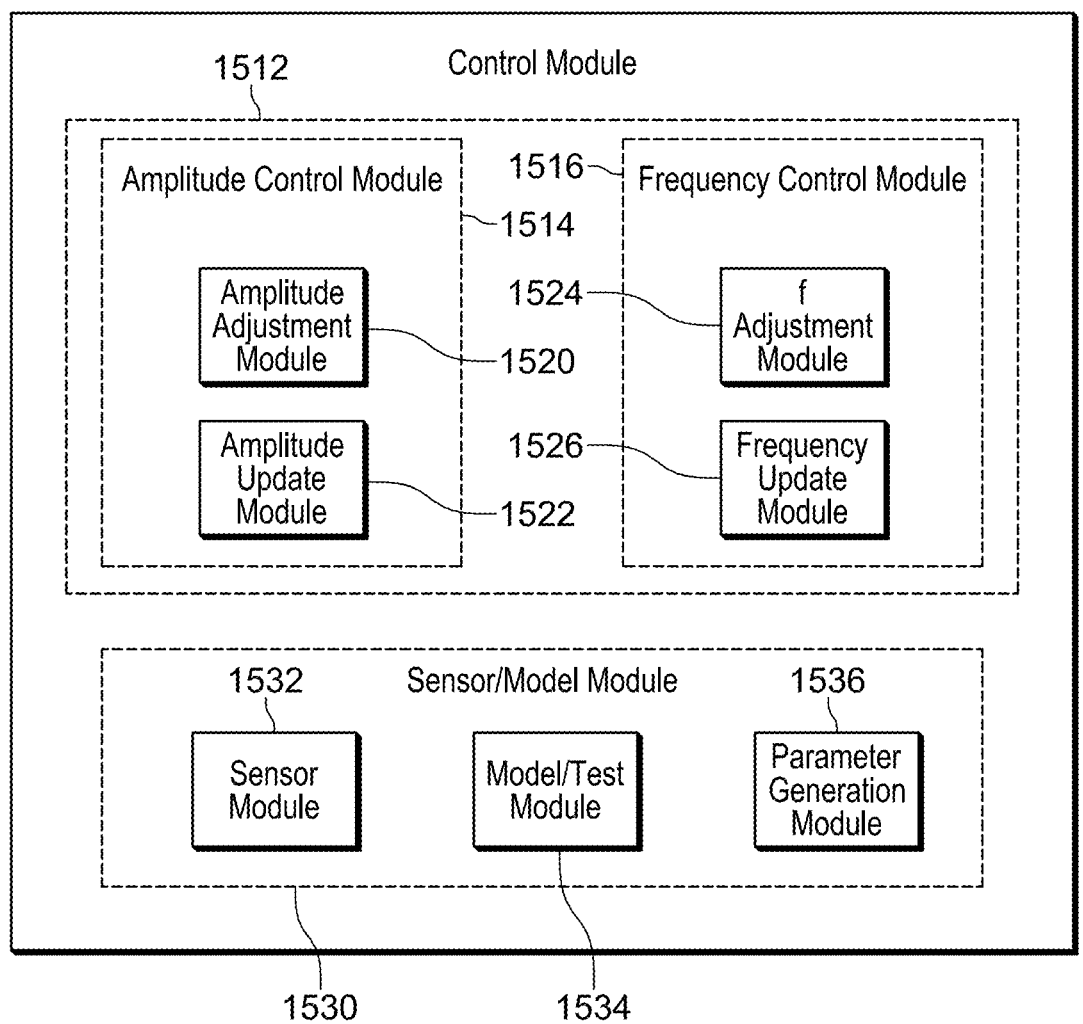
FIG. 15 shows a functional block diagram of an example control module arranged in accordance with various embodiments.

FIG. 15 incorporates various components of FIGS. 1-14. Control module 1510 includes power generation module 1512 and a sensor/model module 1546. Power generation module 1512 includes amplitude control module 1514, which further includes amplitude adjustment module 1520 and amplitude update module 1522. Power generation module 1512 includes frequency control module 1516, which further includes frequency adjustment module 1524 and frequency update module 1526. Control module 1510 also includes a sensor/model module 1540. Sensor/model module 1540 include sensor module 1542, model/test model 1544, and parameter generation module 1546. In various embodiments, control module 1510 includes one or a plurality of processors that execute code associated with the module sections or modules 1510, 1512, 1514, 1516, 1520, 1522, 1524, 1526, 1530, 1532, 1534, and 1536. Operation of the module sections or modules 1510, 1512, 1514, 1516, 1520, 1522, 1524, 1526, 1530, 1532, 1534, and 1536 is described below with respect to the method of FIG. 16.

For further defined structure of modules or controllers described herein, see the below provided flow chart of FIG. 16 and the below provided definition for the term "module". The systems disclosed herein may be operated using numerous methods, examples, and various control system methods of which are illustrated herein. Although the following operations are primarily described with respect to the implementations described herein, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 16:
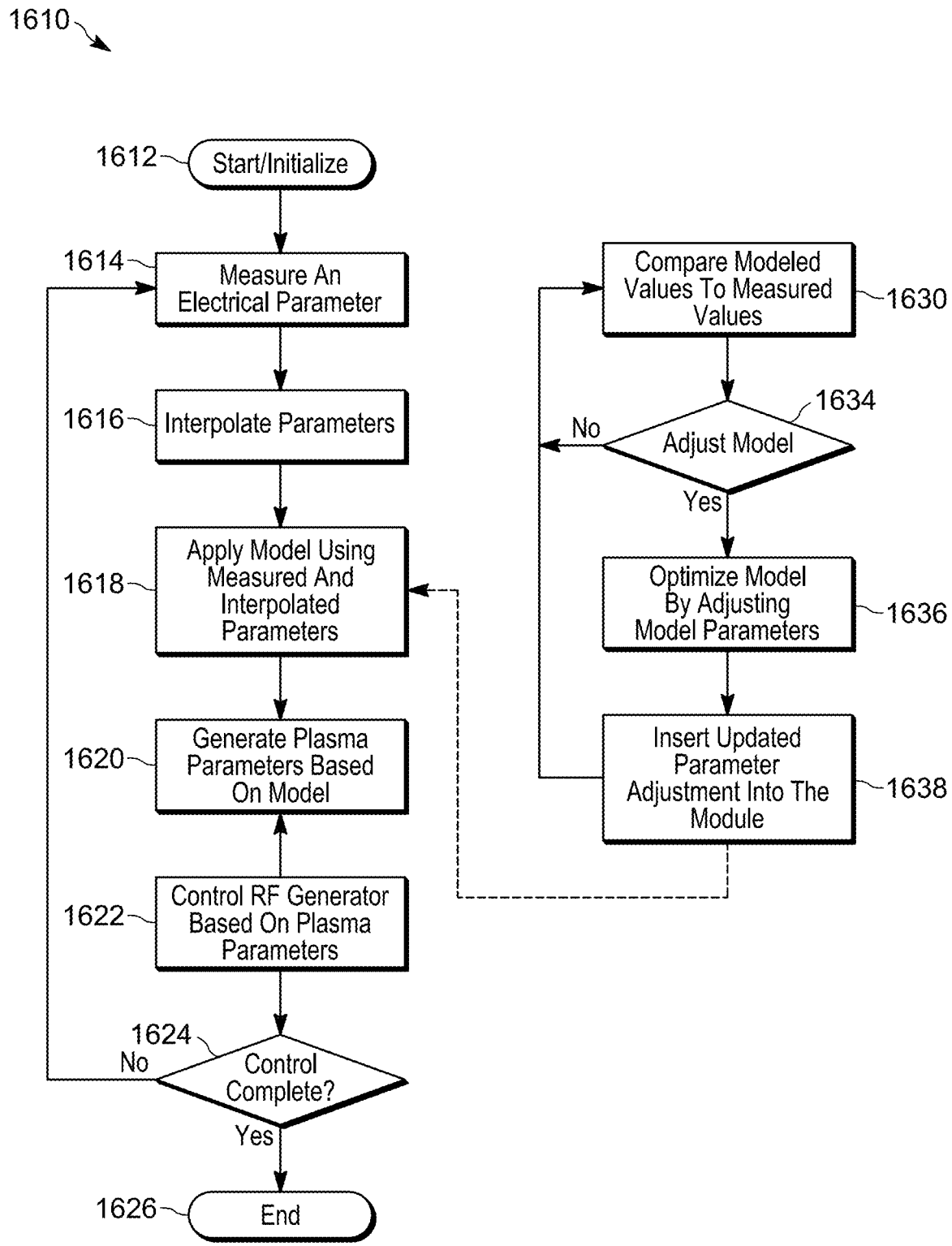
FIG. 16 shows a flow chart of operation of a control system arranged in accordance with the principals of the present disclosure.

FIG. 16 shows a flow chart of a control system 1610 for performing plasma control for, for example, the power delivery systems described above. Control begins at block 1612 which initializes variables for conducting the process. Control advances to block 1614 which measures an electrical parameter as described above. At block 1616 one or more parameters may be interpolated based on the measured electrical parameter, though such interpolation is design-dependent and may not be necessary. Thus, in various configurations, block 1616 may be omitted. Control proceeds to block 1618 where a model is applied to one or more measured and interpolated parameters. By way of nonlimiting example, block 1618 may determine, among other parameters, an effective ion potential indicative of the ion energy or ion potential of ions traversing the plasma sheath. From the effective ion potential over a period of time, an IEDF can be determined, such as at block 1620. From the plasma parameters generated at block 1620, the RF power generator control commands can be determined and controlled in order to control a RF power generator. Control proceeds to block 1624 which determines if the control cycle is complete. If the control cycle is not complete, complete control returns to block 1614. If the control cycle is complete, the process ends at block 1626.

At block 1630 the model values are compared to measured values to determine the accuracy of the model. Based on the comparison, a determination is made at block 1634 whether to adjust the model. If the model needs no adjustment, control returns to block 1630. If at block 1634 is determined to adjust the model, control proceeds to block 1636 which optimizes the model by adjusting various model parameters using the approach described above. At block 1638 the updated electrical or plasma parameters are inserted into the model. Following block 1638, control returns to block 1630.

In one application, various parameters output from the model described above can be used to control the application of the respective first and second powers to second electrode 316 of FIG. 3 to generate plasma 322 having an electron density $n_e$. In such applications where multiple RF frequencies are harmonically related, it can be shown that the sheath thickness and thus ion energy or potential can be controlled.

The sheath thickness as a function of time is shown in equation (12):

$$s(t)=\Sigma_n s_n(1-\sin(w_n t+\phi_{n-1}))  \quad (12)$$

where:

$\omega_n=2\pi f$ is a harmonic of the fundamental frequency $f_1$ of the multi-frequency system; and $\phi_n$ is the relative phase between the frequencies, where $\phi_1=0$ by definition.

The amplitude of each sheath oscillation component is defined in equation (13):

$$s_n = \frac{I_n}{en_e \omega_n A} \forall\, n \quad (13)$$

where:

$I_n$ is the drive current associated with $\omega_n$;

$n_e$ is the electron density;

A is the electrode discharge area; and e is electron charge.

Equations (1) and (2) demonstrate that the thickness of the sheath varies in accordance with the relative phase between $\phi$, in the case of equation (12), and the applied power, characterized by $I_n$ in the case of equation (13). In terms of the IEDF, the applied power is sometimes referred to as the relative amplitude variable or width, and the relative phase $\phi$ is sometimes referred to as the relative phase variable or skew.

[cow] A useful property characterizing the sheath can be found with respect to the time dependent sheath voltage or sheath potential described below with respect to equation (14):

$$V_{bias}(t) = \frac{en_e}{2\varepsilon_0}s^2(t) \quad (14)$$

where:

$\varepsilon_0$ is the permittivity of free space, and e, $n_e$, and $s^2(t)$ are as described above.

As can be seen from the above equations (12)-(14), the thickness of the sheath varies as a function of the frequency of the bias power supply. Since the surface area 328 of powered sheath 334 causes a change in capacitance between plasma 322 and electrode 316, variation of the sheath thickness in accordance with equation (12) causes a change in the sheath capacitance. A change in sheath capacitance causes a corresponding impedance fluctuation. The corresponding impedance fluctuation interrupts the consistent delivery of forward power from the source power supply, such as second power source 320 of FIG. 3.

The systems and methods described herein may provide targeted feedback to control systems and subsystems that influence the specific parameters being measured, while conventional systems compensate for changes with incorrect actuators. The systems and methods described herein provide insight into the process dynamics and evolution in real time. The invention further provides ion energy feedback that can be used to control actuators in RF and direct current power generators to tailor ion energies impacting the substrate. Plasma density and electron temperature feedback can be used to cohesively control source and bias generators to reach a desired process result. The systems and methods described herein further enable implementation of a real-time plasma sheath model valid for typical semiconductor RF frequencies. Further, the systems and methods described herein implement a mathematical description of the relevant electrical elements, including the plasma sheath, to derive nodal voltage and current relationships at various nodes.

The systems and methods described herein, in various configuration, control IEDF shape. The systems and methods described herein, in various configuration, determine the impact of process parameters in real time in response to process parameters, such as pulsing rate, direct current, pressure, power, and gas flows. The systems and methods described herein, in various configuration, can fingerprint systems. The systems and methods described herein, in various configuration, can track system aging and conditioning. The systems and methods described herein, in various configuration, control specific actuators that directly relate to the parameters provided by this invention. The systems and methods described herein, in various configuration, can provide a metric for feedback or feedforward control. The metric could, for example, include the effective ion potential.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A controller for a plasma generation system, comprising:
a model evaluation module configured to receive a sensed value that varies in accordance with a state of a plasma controlled by a RF power generator, the model evaluation module generating a plasma parameter, wherein the plasma parameter varies in accordance with the sensed value;
a model integration module configured to receive the plasma parameter and configured to integrate the plasma parameter and output an integrated model parameter;
an IEDF evaluation module configured to receive the integrated model parameter and generate an ion energy distribution function (IEDF) in accordance with the integrated model parameter;
an IEDF controller module configured to receive the IEDF and generate a signal for controlling a RF generator; and
a RF power generator control module configured to receive the signal and generate a RF generator control signal to control at least one of power, frequency, or phase of the RF power generator.

2. The controller of claim 1, comprising an optimization module configured to receive the integrated model parameter and compare the integrated model parameter with a predetermined parameter used to define the model and revise the predetermined parameter in accordance with the comparison.

3. The controller of claim 1, wherein the RF power generator is a bias RF generator, and the IEDF varies in accordance with the at least one of the power, frequency, or phase of the bias RF generator.

4. The controller of claim 1, wherein the integrated model parameter varies in accordance with an ion potential of the plasma.

5. The controller of claim 1, wherein the integrated model parameter is an effective ion potential waveform, and the effective ion potential waveform characterizes an ion potential of ions accelerated by the plasma sheath.

6. The controller of claim 5, wherein the RF generator control module is configured to receive the effective ion potential waveform to control at least one of power, frequency, or phase of the RF power generator.

7. The controller of claim 1, wherein the RF power generator comprises a plurality of RF power generators, and the output of the RF power generators is combined and applied to the plasma.

8. The controller of claim 1, wherein the sensed value can be detected at a plurality of positions in the plasma generation system.

9. The controller of claim 1, wherein the RF power generator provides an output signal that may be one of a sinusoidal signal, square wave signal, rectangular wave signal, triangular signal, gaussian signal, piecewise linear signal, narrow pulse voltage peak followed by a ramp down signal, or an arbitrary signal.

10. The controller of claim 9, wherein the output signal is modulated by a pulse signal.

11. The controller of claim 10, wherein the pulse signal is one of trapezoidal, triangular, gaussian, or arbitrary in shape.

12. A RF power generation system, comprising:
a RF power generator generating a RF output signal applied to a load to generate a plasma;
a model evaluation module configured to receive a sensed value that varies in accordance with a state of the plasma, the model evaluation module determining a plasma parameter, wherein the plasma parameter varies in accordance with the sensed value;
a model integration module configured to receive the plasma parameter and configured to integrate the plasma parameter and output an integrated model parameter; and
a RF generator control module configured to receive the integrated model parameter and generate a RF generator control signal to control at least one of power, frequency, or phase of the RF power generator in accordance with the integrated model parameter.

13. The RF power generation system of claim 12, wherein the RF power generator is a bias RF generator, and the integrated model parameter varies in accordance with at least one of frequency, or phase of the bias RF generator.

14. The RF power generation system of claim 12 comprising an IEDF evaluation module configured to receive the integrated model parameter and generate an ion energy distribution function (IEDF) in accordance with the integrated model parameter.

15. The RF power generation system of claim 14, wherein the RF generator control module is configured to receive the IEDF and generate the RF generator control signal to control at least one of power, frequency, or phase of the RF power generator in accordance with the integrated model parameter or the IEDF.

16. The RF power generation system of claim 14 further comprising an IEDF controller module configured to receive the IEDF and generate a signal for controlling a RF generator.

17. The RF power generation system of claim 16, wherein the RF generator control module is configured to receive the IEDF and generate the RF generator control signal to control at least one of power, frequency, or phase of the RF power generator in accordance with the integrated model parameter or the IEDF.

18. The RF power generation system of claim 14, wherein the RF power generator is a bias RF generator, and the IEDF varies in accordance with the at least one of the power, frequency, or phase of the bias RF generator.

19. The RF power generation system of claim 12, comprising an optimization module configured to receive the integrated model parameter and compare the integrated model parameter with predetermined parameter used to define the model and revise the predetermined parameter in accordance with the comparison.

20. The RF power generation system of claim 12, wherein the integrated model parameter varies in accordance with an ion potential of ions accelerated by the plasma sheath.

21. The RF power generation system of claim 12, wherein the RF power generator comprises a plurality of RF power generators, and the output of the RF power generators is combined and applied to the plasma.

22. The RF power generation system of claim 12, wherein the sensed value can be detected at a plurality of positions in the RF power generation system.

23. The RF power generation system of claim 12, wherein the RF output signal is one of a sinusoidal signal, square wave signal, rectangular wave signal, triangular signal, gaussian signal, piecewise linear signal, narrow pulse voltage peak followed by a ramp down signal, or an arbitrary signal.

24. The RF power generation system of claim 23, wherein the RF output signal is modulated by a pulse signal.

25. The controller of claim 24, wherein the pulse signal is one of trapezoidal, triangular, gaussian, or arbitrary in shape.

26. A non-transitory computer-readable medium storing instructions, the instructions comprising:
 generating a RF output signal applied to a load to generate a plasma;
 receiving a sensed value that varies in accordance with a state of the plasma, and determining a plasma parameter, wherein the plasma parameter varies in accordance with the sensed value;
 receiving the plasma parameter, integrating the plasma parameter, and generating an integrated model parameter; and
 receiving the integrated model parameter, generating a RF generator control signal to control at least one of power, frequency, or phase of a RF power generator in accordance with the integrated model parameter.

27. The non-transitory computer-readable medium storing instructions of claim 26, wherein the RF power generator is a bias RF generator, and the integrated model parameter varies in accordance with at least one of frequency, or phase of the bias RF generator.

28. The non-transitory computer-readable medium storing instructions of claim 26, the instructions further comprising receiving the integrated model parameter and generating an ion energy distribution function (IEDF) in accordance with the integrated model parameter.

29. The non-transitory computer-readable medium storing instructions of claim 28, the instructions further comprising receiving the IEDF and generating the RF generator control signal to control at least one of power, frequency, or phase of the RF power generator in accordance with the integrated model parameter or the IEDF.

30. The non-transitory computer-readable medium storing instructions of claim 28, the instructions further comprising receiving the IEDF and generating a signal for controlling a RF generator.

31. The non-transitory computer-readable medium storing instructions of claim 30, the instructions further comprising receiving the IEDF and generating the RF generator control signal to control at least one of power, frequency, or phase of the RF power generator in accordance with the integrated model parameter or the IEDF.

32. The non-transitory computer-readable medium storing instructions of claim 28, wherein the RF power generator is a bias RF generator, and the IEDF varies in accordance with the at least one of the power, frequency, or phase of the bias RF generator.

33. The non-transitory computer-readable medium storing instructions of claim 26, the instructions further comprising receiving the integrated model parameter, comparing the integrated model parameter with predetermined parameter used to define the model and, revising the predetermined parameter in accordance with the comparison.

34. The non-transitory computer-readable medium storing instructions of claim 26, wherein the integrated model parameter varies in accordance with an ion potential of ions accelerated by the plasma sheath.

35. The non-transitory computer-readable medium storing instructions of claim 26, wherein the RF power generator comprises a plurality of RF power generators, and the output of the RF power generators is combined and applied to the plasma.

36. The non-transitory computer-readable medium storing instructions of claim 26, wherein the sensed value can be detected at a plurality of positions to obtain the sensed value.

37. The non-transitory computer-readable medium storing instructions of claim 26, wherein the RF output signal is one of a sinusoidal signal, square wave signal, rectangular wave signal, triangular signal, gaussian signal, piecewise linear signal, narrow pulse voltage peak followed by a ramp down signal, or an arbitrary signal.

38. The non-transitory computer-readable medium storing instructions of claim 37, wherein the RF output signal is modulated by a pulse signal.

39. The non-transitory computer-readable medium storing instructions of claim 38, wherein the pulse signal is one of trapezoidal, triangular, gaussian, or arbitrary in shape.

* * * * *